(12) United States Patent
Kim et al.

(10) Patent No.: US 11,664,418 B2
(45) Date of Patent: May 30, 2023

(54) SEMICONDUCTOR DEVICES HAVING GATE ISOLATION LAYERS

(71) Applicant: SAMSUNG ELECTRONICS CO., LTD., Suwon-si (KR)

(72) Inventors: Seonbae Kim, Hwaseong-si (KR); Woojin Lee, Hwaseong-si (KR); Seunghoon Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 105 days.

(21) Appl. No.: 17/400,358

(22) Filed: Aug. 12, 2021

(65) Prior Publication Data
US 2022/0254880 A1     Aug. 11, 2022

(30) Foreign Application Priority Data

Feb. 5, 2021   (KR) .................. 10-2021-0016530

(51) Int. Cl.
*H01L 29/76* (2006.01)
*H01L 29/94* (2006.01)
(Continued)

(52) U.S. Cl.
CPC .... *H01L 29/0649* (2013.01); *H01L 29/41791* (2013.01); *H01L 29/42364* (2013.01); *H01L 29/785* (2013.01)

(58) Field of Classification Search
CPC ........... H01L 29/0649; H01L 29/41791; H01L 29/42364; H01L 29/785; H01L 27/0886; H01L 23/481; H01L 23/50; H01L 23/5226; H01L 23/5283; H01L 23/5386; H01L 29/42356; H01L 21/823481; H01L 21/76829; H01L 21/823468; H01L 21/823475
(Continued)

(56) References Cited

U.S. PATENT DOCUMENTS 11,282,787 B2 * 3/2022 Park .................. H01L 27/10855
11,329,045 B2 * 5/2022 Weng .................. H01L 29/0649
(Continued)

FOREIGN PATENT DOCUMENTS

KR    1996-0026210 A    7/1996
KR    2002-0091891 A    12/2002
(Continued)

*Primary Examiner* — Theresa T Doan
(74) *Attorney, Agent, or Firm* — Lee IP Law, P.C.

(57) ABSTRACT

A semiconductor device includes active regions on a substrate, a gate structure intersecting the active regions, a source/drain region on the active regions and at a side surface of the gate structure, a gate spacer between the gate structure and the source/drain region, the gate spacer contacting the side surface of the gate structure, a lower source/drain contact plug connected to the source/drain region, a gate isolation layer on the gate spacer, an upper end of the gate isolation layer being at a higher level than an upper surface of the gate structure and an upper surface of the lower source/drain contact plug, a capping layer covering the gate structure, the lower source/drain contact plug, and the gate isolation layer, and an upper source/drain contact plug connected to the lower source/drain contact plug and extending through the capping layer.

20 Claims, 45 Drawing Sheets

(51) Int. Cl.
  *H01L 29/06* (2006.01)
  *H01L 29/78* (2006.01)
  *H01L 29/423* (2006.01)
  *H01L 29/417* (2006.01)

(58) Field of Classification Search
  USPC .......................................................... 257/365
  See application file for complete search history.

(56) References Cited

U.S. PATENT DOCUMENTS

| | | |
|---|---|---|
| 2008/0153276 A1 | 6/2008 | Hwang et al. |
| 2013/0175619 A1 | 7/2013 | Fan et al. |
| 2013/0277764 A1 | 10/2013 | Li et al. |
| 2014/0264478 A1 | 9/2014 | Liang et al. |
| 2015/0311082 A1 | 10/2015 | Bouche et al. |
| 2019/0013400 A1 | 1/2019 | Lee et al. |
| 2020/0287042 A1 | 9/2020 | Lee et al. |

FOREIGN PATENT DOCUMENTS

| | | |
|---|---|---|
| KR | 10-2008-0060021 A | 7/2008 |
| KR | 10-2018-0118027 A | 10/2018 |

\* cited by examiner

US 11,664,418 B2

SEMICONDUCTOR DEVICES HAVING GATE ISOLATION LAYERS

CROSS-REFERENCE TO THE RELATED APPLICATION

Korean Patent Application No. 10-2021-0016530, filed on Feb. 5, 2021, in the Korean Intellectual Property Office, and entitled: "Semiconductor Devices Having Gate Isolation Layers," is incorporated by reference herein in its entirety.

BACKGROUND

1. Field

Exemplary embodiments of the disclosure relate to a semiconductor device having a gate isolation layer.

2. Description of the Related Art

In accordance with a tendency of semiconductor devices toward miniaturization, technology associated with a Fin-FET or a multi-bridge channel transistor, which has a three-dimensional structure, has been introduced in order to reduce a short channel effect.

SUMMARY

A semiconductor device according to exemplary embodiments of the disclosure may include active regions disposed on a substrate, a gate structure intersecting the active regions, a source/drain region disposed on the active regions while being disposed at a side surface of the gate structure, a gate spacer disposed between the gate structure and the source/drain region while contacting the side surface of the gate structure, a lower source/drain contact plug connected to the source/drain region, a gate isolation layer disposed on the gate spacer, an upper end of the gate isolation layer being disposed at a higher level than an upper surface of the gate structure and an upper surface of the lower source/drain contact plug, a capping layer covering the gate structure, the lower source/drain contact plug and the gate isolation layer, and an upper source/drain contact plug connected to the lower source/drain contact plug while extending through the capping layer.

A semiconductor device according to exemplary embodiments of the disclosure may include active regions disposed on a substrate, channel layers disposed on the active regions while being vertically spaced apart from one another, a gate structure intersecting the active regions while surrounding the channel layers, the gate structure including a gate electrode, and a gate insulating layer between the channel layers and the gate electrode, a source/drain region disposed on the active regions while being disposed at a side surface of the gate structure, a gate spacer disposed between the gate structure and the source/drain region while contacting the side surface of the gate structure, an inner spacer disposed under the channel layers while contacting a side surface of the source/drain region, a lower source/drain contact plug disposed on the source/drain region, a gate isolation layer disposed on the gate spacer, an upper end of the gate isolation layer being disposed at a higher level than an upper surface of the gate structure and an upper surface of the lower source/drain contact plug, a capping layer covering the gate structure, the lower source/drain contact plug and the gate isolation layer, and an upper source/drain contact plug connected to the lower source/drain contact plug while extending through the capping layer.

A semiconductor device according to exemplary embodiments of the disclosure may include active regions disposed on a substrate while extending in a first horizontal direction, the active regions being spaced apart from one another in a second horizontal direction intersecting the first horizontal direction, a gate structure intersecting the active regions while extending in the second horizontal direction, a source/drain region disposed on the active regions while being disposed at a side surface of the gate structure, a gate spacer disposed between the gate structure and the source/drain region while contacting the side surface of the gate structure, an interlayer insulating layer covering the source/drain region, a lower source/drain contact plug connected to the source/drain region while extending through the interlayer insulating layer, a gate isolation layer covering the gate spacer and the interlayer insulating layer, an upper end of the gate isolation layer being disposed at a higher level than an upper surface of the gate structure and an upper surface of the lower source/drain contact plug, a capping layer covering the gate structure, the lower source/drain contact plug and the gate isolation layer, an upper insulating layer covering the capping layer, and an upper source/drain contact plug connected to the lower source/drain contact plug while extending through the capping layer and the upper insulating layer. The upper surface of the gate structure may be disposed at a lower level than the upper surface of the lower source/drain contact plug.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
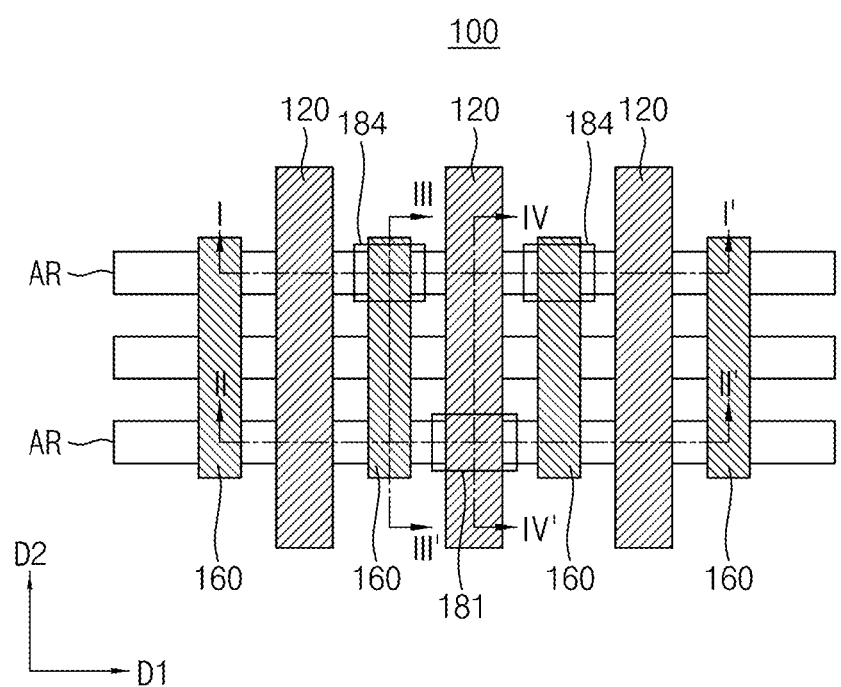
FIG. 1 is a layout of a semiconductor device according to an example embodiment.
Figure 2A:
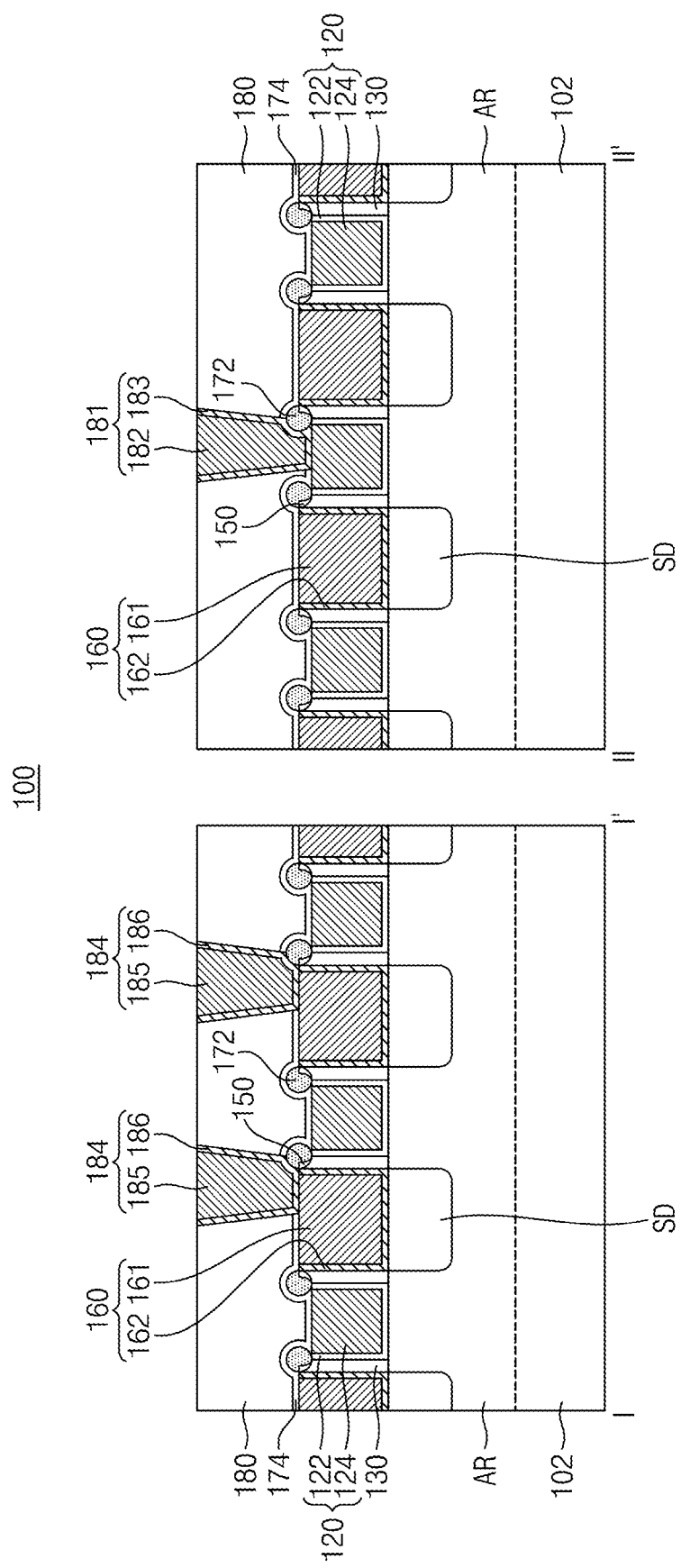
FIGS. 2A and 2B are vertical cross-sectional views along lines I-I', II-II' III-III' and IV-IV' in FIG. 1.
Figure 2B:
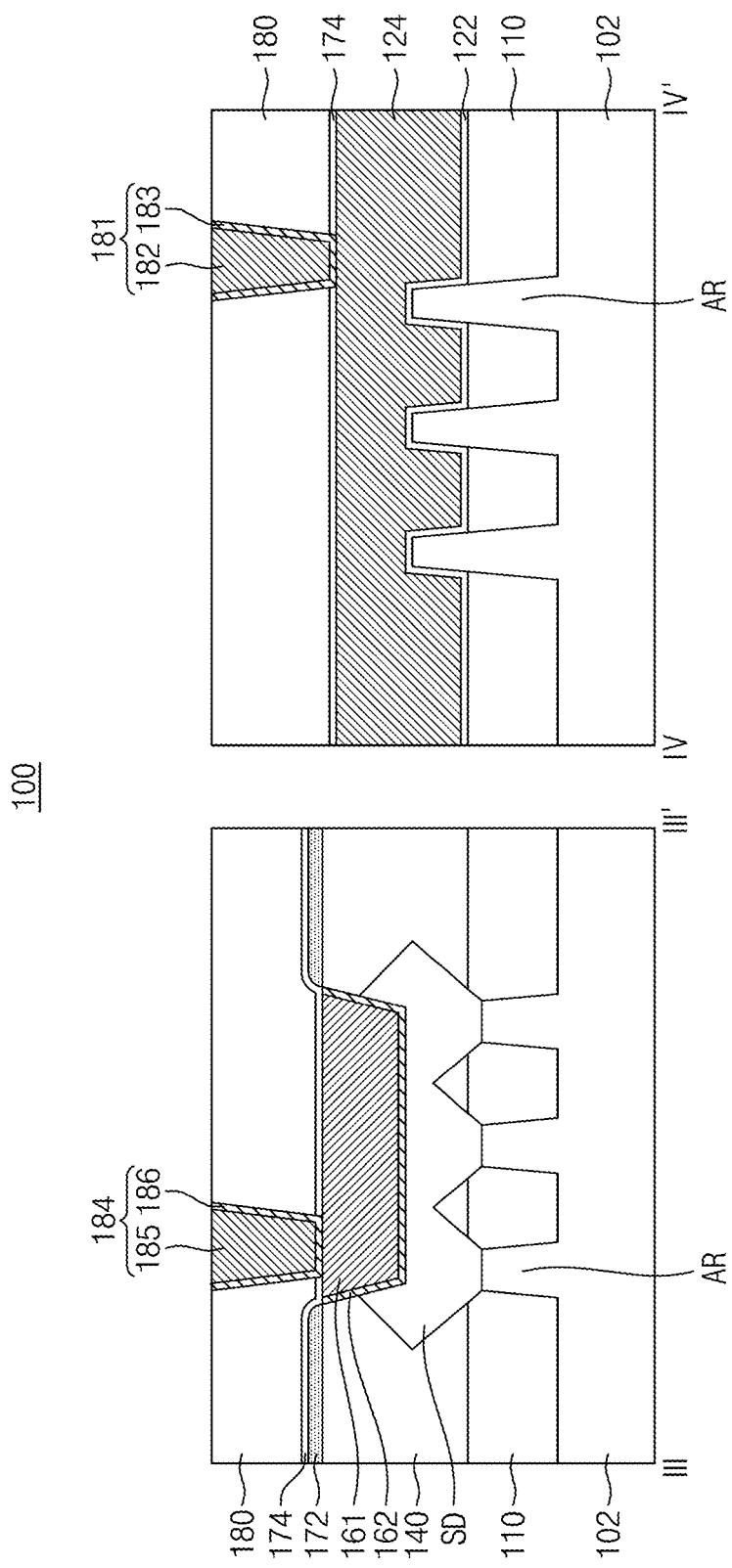

FIG. 1 is a layout of a semiconductor device according to an example embodiment. FIGS. 2A and 2B illustrate vertical cross-sectional views along lines I-I', II-II' III-III' and IV-IV' in FIG. 1, and FIG. 3 illustrates enlarged views of portions of the semiconductor device in FIG. 2A.

Figure 3:
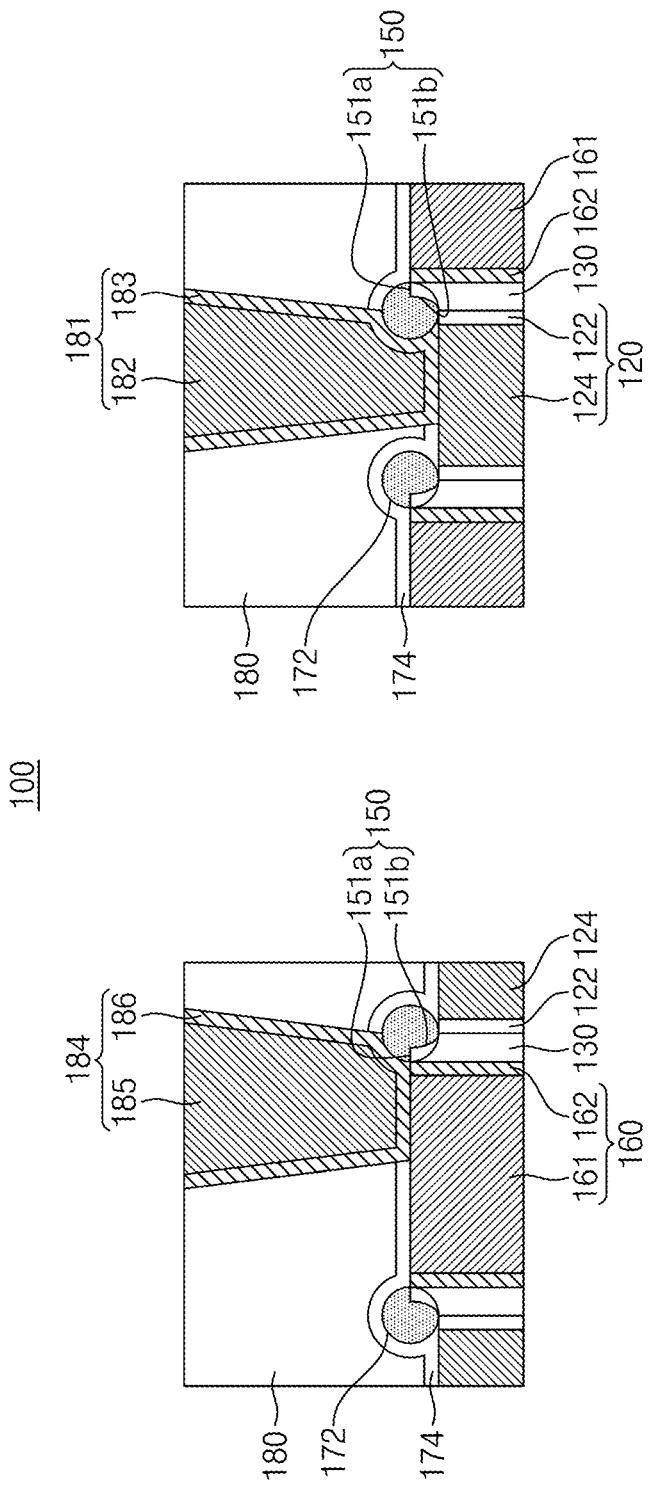
FIG. 3 are enlarged views of contact plugs in the semiconductor device of FIG. 2A.

Referring to FIGS. 1 to 3, a semiconductor device 100 may include a substrate 102, an element isolation layer 110, gate structures 120, gate spacers 130, source/drain regions SD, an interlayer insulating layer 140, upper spacers 150, lower source/drain contact plugs 160, gate isolation layers 172, an upper insulating layer 180, gate contact plugs 181, and upper source/drain contact plugs 184.

The substrate 102 may include active regions AR extending in a first horizontal direction D1 while being spaced apart from one another in a second horizontal direction D2. In an embodiment, the active regions AR may protrude upwards from an upper surface of the substrate 102, and may have a fin shape. The substrate 102 may include a semiconductor material. For example, the substrate 102 may be a silicon substrate, a germanium substrate, a silicon germanium substrate, or a silicon-on-insulator (SOI) substrate. The active regions AR may include the same material as the substrate 102.

The element isolation layer 110 may be disposed on the upper surface of the substrate 102, and may define the active regions AR. The element isolation layer 110 may cover the upper surface of the substrate 102, and may partially cover side surfaces of the active regions AR. Upper surfaces of the active regions AR may be disposed at a higher level than an upper surface of the element isolation layer 110. In an embodiment, the element isolation layer 110 may include, e.g., silicon oxide, silicon nitride, silicon oxynitride, or a low-k dielectric material.

The gate structures 120 may extend in the second horizontal direction D2 while being spaced apart from one another in the first horizontal direction D1. The gate structures 120 may intersect the active regions AR. Each gate structure 120 may include a gate insulating layer 122 and a gate electrode 124. The gate insulating layer 122 may surround a lower surface and a side surface of the gate electrode 124, and may extend in the second horizontal direction D2. The gate insulating layer 122 may cover the element isolation layer 110 and a portion of a corresponding one of the active regions AR protruding upward beyond the element isolation layer 110. The gate electrode 124 may be disposed on the gate insulating layer 122, and may extend in the second horizontal direction D2. The gate structure 120 may further include a metal layer disposed between the gate insulating layer 122 and the gate electrode 124, to adjust a work function of the gate electrode 124.

The gate insulating layer 122 may include a high-k dielectric material, e.g., hafnium oxide, hafnium oxynitride, etc. The gate electrode 124 may include at least one of, e.g., W, Al, Co, Ti, Ta, poly-Si, SiGe, or a metal alloy thereof.

The gate spacers 130 may be disposed at side surfaces of the gate structures 120, and may extend in the second horizontal direction D2. For example, each pair of gate spacers 130 may be disposed to correspond to each of the gate structures 120, such that the gate spacers 130 of the pair may face each other while contacting the gate insulating layer 122 of the corresponding gate structure 120 under the condition in which the gate electrode 124 of the corresponding gate structure 120 is interposed between the gate spacers 130. As shown in FIG. 3, an upper surface of each gate spacer 130 may be an inclined surface, e.g., an entirety of the upper surface of each gate spacer 130 may curve downwardly to have a concave shape. For example, as further illustrated in FIG. 3, the height of the gate spacer 130 may be gradually reduced as the upper surface of the gate spacer 130 becomes nearer to a corresponding, e.g., adjacent, gate structure 120. An upper end of the gate spacer 130 may be disposed at a higher level than an upper surface of the corresponding, e.g., adjacent, gate structure 120. For example, an upper end of the upper surface of the gate spacer 130 may be disposed at the same level as an upper surface of a corresponding one of the lower source/drain contact plugs 160, and a lower end of the upper surface of the gate spacer 130 may be disposed at the same level as the upper surface of the gate structure 120, e.g., the upper surface of the gate spacer 130 may curve downwardly from the upper surface of the lower source/drain contact plugs 160 toward the upper surface of the gate structure 120. In an embodiment, the gate spacer 130 may be constituted by one or more layers. The gate spacer 130 may include, e.g., silicon oxide, silicon nitride, silicon oxynitride, or a combination thereof.

The source/drain regions SD may be disposed on the active regions AR, and may be disposed at opposite sides of the gate structures 120. Although a merged structure of the source/drain regions SD on the active regions AR spaced apart from one another in the second horizontal direction D2 is shown in FIG. 2B, the exemplary embodiments of the disclosure are not limited thereto. In an embodiment, the source/drain regions SD may be spaced apart from one another in the second horizontal direction D2. The source/drain regions SD may be semiconductor layers epitaxially grown from the active regions AR. The source/drain regions SD may apply compressive stress or tensile stress to the active regions AR, and may include an n-type impurity or a p-type impurity.

The interlayer insulating layer 140 may cover the element isolation layer 110 and the source/drain regions SD. The interlayer insulating layer 140 may include, e.g., silicon oxide, silicon nitride, silicon oxynitride, or a low-k dielectric material, and may be constituted by one or more layers. The low-k dielectric material may include, e.g., undoped silicate glass (USG), borosilicate glass (BSG), phosphosilicate glass (PSG), borophosphosilicate glass (BPSG), plasma enhanced tetraethylorthosilicate (PETEOS), fluoride silicate glass (FSG), a high density plasma (HDP) oxide, or a combination thereof.

The upper spacers 150 may be disposed at the side surfaces of the gate structures 120. For example, the upper spacers 150 may be disposed on the gate spacers 130, respectively, while extending in the second horizontal direction D2. For example, as illustrated in FIG. 3, the upper spacers 150 may be on the inclined, e.g., curved, upper surface of the gate spacers 130, respectively. As further illustrated in FIG. 3, each upper spacer 150 may include an upper surface 151a and a side surface 151b. The upper surface 151a of the upper spacer 150 may be disposed at a higher level than the upper surface of a corresponding one of the gate structures 120, and may be coplanar with an upper surface of a corresponding one of the lower source/drain contact plugs 160. The side surface 151b of the upper spacer 150 may be an inclined, e.g., curved, surface, and a lower end of the side surface 151b of the upper spacer 150 may be disposed at the same level as the upper surface of the corresponding gate structure 120. The upper spacers 150 may include, e.g., silicon oxide, silicon nitride, silicon oxynitride, or a combination thereof. In an embodiment, the upper spacers 150 may include silicon nitride.

Each of the lower source/drain contact plugs 160 may include a lower source/drain contact conductive layer 161 and a lower contact barrier layer 162. The lower source/drain contact plugs 160 may extend through the interlayer insulating layer 140, and may be connected to the source/drain regions SD, respectively. The lower source/drain contact plugs 160 may extend in the second horizontal direction D2 along the source/drain regions SD, and may be electrically connected to the source/drain regions SD, respectively. In addition, the lower source/drain contact plugs 160 may be disposed at opposite sides of the gate structures 120 while contacting the gate spacers 130. The lower contact barrier layer 162 may surround a side surface and a lower surface of the lower source/drain contact conductive layer 161. The lower contact barrier layer 162 may contact corresponding ones of the gate spacers 130, a corresponding one of the source/drain regions SD, and the interlayer insulating layer 140. The source/drain region SD may include a silicide layer at a portion thereof contacting the lower source/drain contact plug 160. The upper surface of the lower source/drain contact plug 160 may be disposed at the same level as an upper surface of the interlayer insulating layer 140. As shown in FIG. 3, the upper surface of the lower source/drain contact plug 160 may be disposed at a higher level than the upper surface of the corresponding gate structure 120.

The lower source/drain contact conductive layer 161 may include, e.g., W, Co, Ru, Mo, or a combination thereof. The lower contact barrier layer 162 may include, e.g., Ti, TiN, Ta, TaN, or a combination thereof.

Each of the gate isolation layers 172 may be disposed on a corresponding one of the gate spacers 130, and may be disposed between corresponding ones of the gate structures 120 and the lower source/drain contact plugs 160. For example, the gate isolation layer 172 may contact a corresponding one of the upper spacers 150 while extending in the second horizontal direction D2, e.g., each upper spacer 150 may be between a corresponding gate spacer 130 and a respective gate isolation layer 172. The gate isolation layer 172 may electrically insulate the corresponding gate electrode 124 from a corresponding one of the upper source/drain contact plugs 184, and may electrically insulate the corresponding lower source/drain contact plug 160 from a corresponding one of the gate contact plugs 181. In addition, as shown in FIG. 2B, the gate isolation layer 172 may cover the upper surface of the interlayer insulating layer 140.

As shown in FIG. 3, the gate isolation layer 172 may have a round cross-section, e.g., as viewed from a vertical cross-sectional view of FIG. 3. An upper end of the gate isolation layer 172 may be disposed at a higher level than the upper surface of the corresponding gate structure 120 and the corresponding lower source/drain contact plug 160. For example, as further illustrated in FIG. 3, a topmost part of the gate isolation layer 172 may be at a higher level than the upper surface of the corresponding gate structure 120 and the upper surface of the lower source/drain contact plug 160 relative to the bottom of the substrate 102. For example, the upper end of the gate isolation layer 172 may extend above each of the upper surface of the corresponding gate structure 120 and the upper surface of the lower source/drain contact plug 160, e.g., so the curved surfaces of the gate isolation layer 172 may be above the corresponding gate structure 120 and the corresponding lower source/drain contact plug 160. Although the gate isolation layer 172 is shown as being disposed only on the corresponding upper spacer 150, the exemplary embodiments of the disclosure are not limited thereto. In an embodiment, the gate isolation layer 172 may partially cover the upper surface of the lower source/drain contact plug 160 or the gate structure 120.

The gate isolation layer 172 may include, e.g., silicon oxide, silicon nitride, aluminum oxide, or a combination thereof. In an embodiment, the gate isolation layer 172 may include aluminum oxide. The maximum horizontal width of the gate isolation layer 172, e.g., along the first horizontal direction D1, may be about 6 nm to about 10 nm, and the maximum vertical width of the gate isolation layer 172, e.g., along a direction perpendicular to the first and second horizontal directions D1 and D2, may be about 6 nm to about 10 nm.

The semiconductor device 100 may further include a capping layer 174. The capping layer 174 may cover the gate isolation layers 172 while extending in a horizontal direction. For example, the capping layer 174 may be conformally disposed along upper surfaces of the gate structures 120, the lower source/drain contact plugs 160, and the gate isolation layers 172. The capping layer 174 may include, e.g., silicon oxide, silicon nitride, silicon oxynitride, or a combination thereof. In an embodiment, the capping layer 174 may include silicon nitride.

The upper insulating layer 180 may cover an upper surface of the capping layer 174. The upper insulating layer 180 may include, e.g., silicon oxide, silicon nitride, silicon oxynitride, or a low-k dielectric material.

The gate contact plugs 181 may be disposed on the gate structures 120, respectively. For example, the gate contact plugs 181 may be connected to the gate electrodes 124, respectively, while extending through the capping layer 174 and the upper insulating layer 180. The gate contact plugs 181 may be electrically connected to the gate structures 120, but may not be electrically connected to the lower source/drain contact plugs 160. Although a lower surface of each gate contact plug 181 is shown as being disposed at the same level as an upper surface of a corresponding one of the gate structures 120 in FIG. 2A, the exemplary embodiments of the disclosure are not limited thereto. In an embodiment, the gate contact plug 181 may partially extend through the gate structure 120, and the lower surface of the gate contact plug 181 may be disposed at a lower level than the upper surface of the gate structure 120.

The gate contact plug 181 may include a gate contact conductive layer 182 and a gate barrier layer 183. The gate barrier layer 183 may surround a side surface and a lower surface of the gate contact conductive layer 182. The gate barrier layer 183 may contact the gate structure 120, the capping layer 174, and the upper insulating layer 180. In an embodiment, the gate contact plug 181 may be vertically misaligned from the gate structure 120, and may contact a corresponding one of the gate isolation layers 172. As shown in FIG. 3, the gate barrier layer 183 may contact the upper surface of the gate structure 120 and an upper surface of the corresponding gate isolation layer 172. The gate contact plug 181 may be concave at a portion thereof contacting the gate isolation layer 172.

The gate contact conductive layer 182 may include, e.g., W, Co, Ru, Mo, or a combination thereof. The gate barrier layer 183 may include, e.g., Ti, TiN, Ta, TaN, or a combination thereof.

The upper source/drain contact plugs 184 may be disposed on the lower source/drain contact plugs 160, respectively. For example, each upper source/drain contact plug 184 may be connected to the lower source/drain contact conductive layer 161 of a corresponding one of the lower source/drain contact plugs 160 while extending through the capping layer 174 and the upper insulating layer 180. The upper source/drain contact plugs 184 may be electrically connected to the lower source/drain contact plugs 160, but may not be electrically connected to the gate structures 120.

In an embodiment, the upper source/drain contact plugs 184 may be disposed on a part of the active regions AR. However, the gate contact plugs 181 may be disposed on the active regions AR different from the active regions AR on which the upper source/drain contact plugs 184 are disposed. As shown in FIG. 1, the upper source/drain contact plugs 184 may be misaligned with respect to the gate contact plugs 181 in the first horizontal direction D1 and the second horizontal direction D2.

Although lower surfaces of the upper source/drain contact plugs 184 are shown as being disposed at the same level as upper surfaces of the lower source/drain contact plugs 160 in FIG. 2A, the exemplary embodiments of the disclosure are not limited thereto. In an embodiment, each upper source/drain contact plug 184 may partially extend through a corresponding one of the lower source/drain contact plugs 160, and the lower surface of the upper source/drain contact plug 184 may be disposed at a lower level than the upper surface of the corresponding lower source/drain contact plug 160.

The upper source/drain contact plug 184 may include an upper source/drain contact conductive layer 185 and an upper contact barrier layer 186. The upper contact barrier layer 186 may surround a side surface and a lower surface of the upper source/drain contact conductive layer 185. In an embodiment, the upper source/drain contact plug 184 may be vertically misaligned with the lower source/drain contact plug 160, and may contact a corresponding one of the gate isolation layers 172. As shown in FIG. 3, the upper contact barrier layer 186 may, e.g., directly, contact the upper surface of the lower source/drain contact plug 160 and the upper surface of the corresponding gate isolation layer 172. The upper source/drain contact plug 184 may be concave at a portion thereof contacting the gate isolation layer 172.

The upper source/drain contact conductive layer 185 may include the same material as the gate contact conductive layer 182. The upper contact barrier layer 186 may include the same material as the gate barrier layer 183.

FIGS. 4A to 16B are vertical cross-sectional views illustrating stages in a method of manufacturing the semiconductor device shown in FIGS. 2A and 2B. Description of configurations described previously with reference to FIGS. 1 to 3 will not be repeated.

Figure 4A:
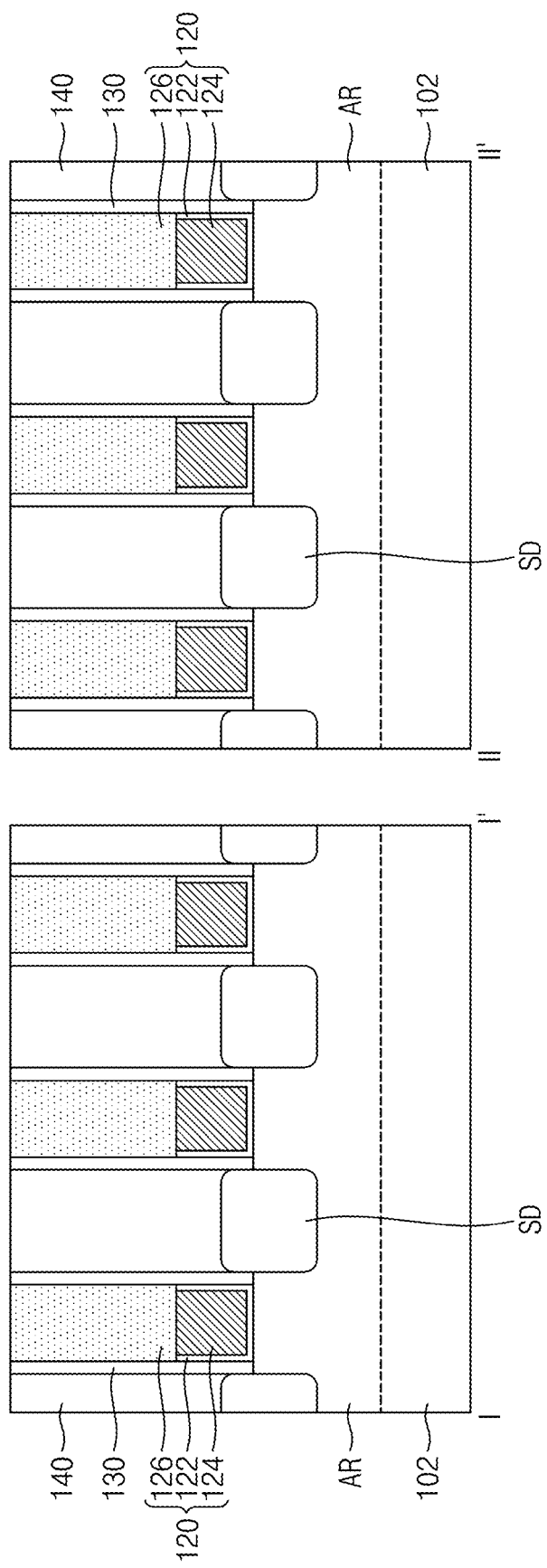
FIGS. 4A to 16B are vertical cross-sectional views of stages in a method of manufacturing the semiconductor device shown in FIGS. 2A and 2B.
Figure 4B:
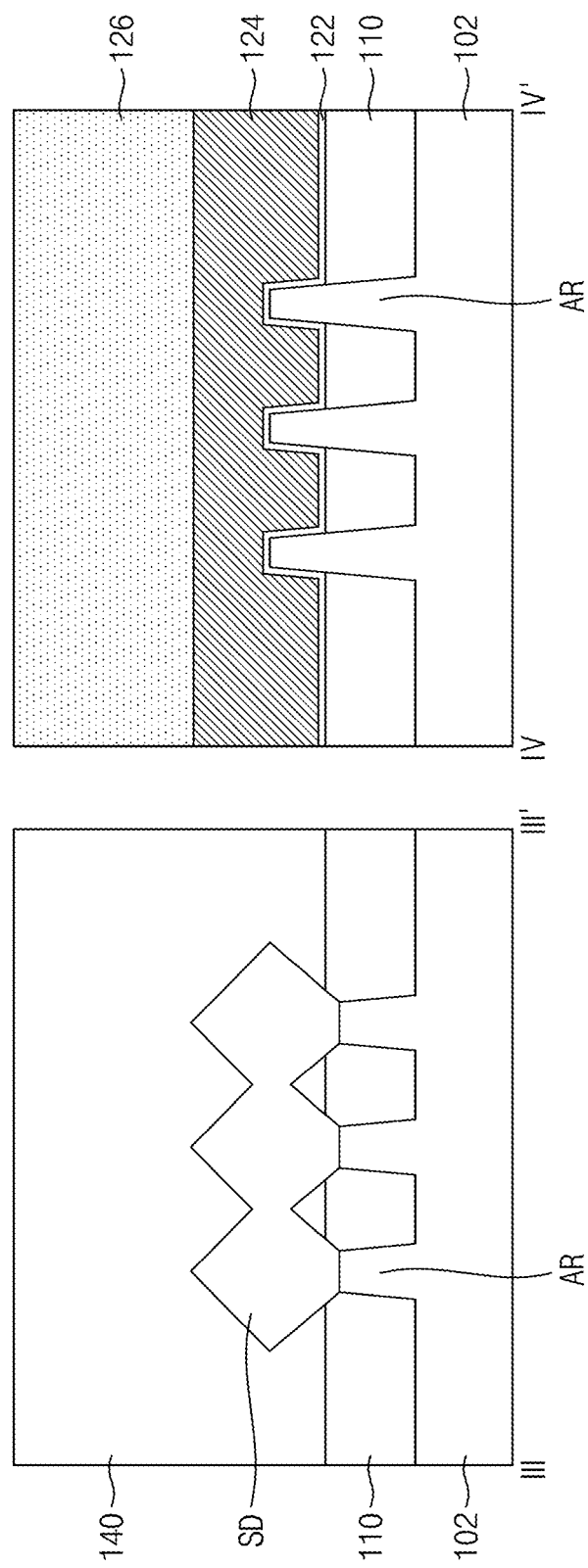

Referring to FIGS. 4A and 4B, the substrate 102, the active regions AR on the substrate 102, the element isolation layer 110 covering lower portions of the active regions AR, the gate structures 120 intersecting the active regions AR, the gate spacers 130 contacting side surfaces of the gate structures 120, the source/drain regions SD disposed on the active regions AR while contacting the gate spacers 130, and the interlayer insulating layer 140 covering the source/drain regions SD may be provided.

Each gate structure 120 may include the gate insulating layer 122, the gate electrode 124, and a gate capping layer 126. The gate capping layer 126 may be disposed on the gate insulating layer 122 and the gate electrode 124 while being disposed between adjacent ones of the gate spacers 130. In an embodiment, the gate structures 120 may be formed through a replacement metal gate (RMG) process. For example, the gate structures 120 may be formed by forming the source/drain regions SD and an interlayer insulating layer 140 covering the source/drain regions SD, removing a dummy gate electrode among the gate spacers 130, and depositing an insulating material, a conductive material, and a capping material among the gate spacers 130.

Figure 5A:
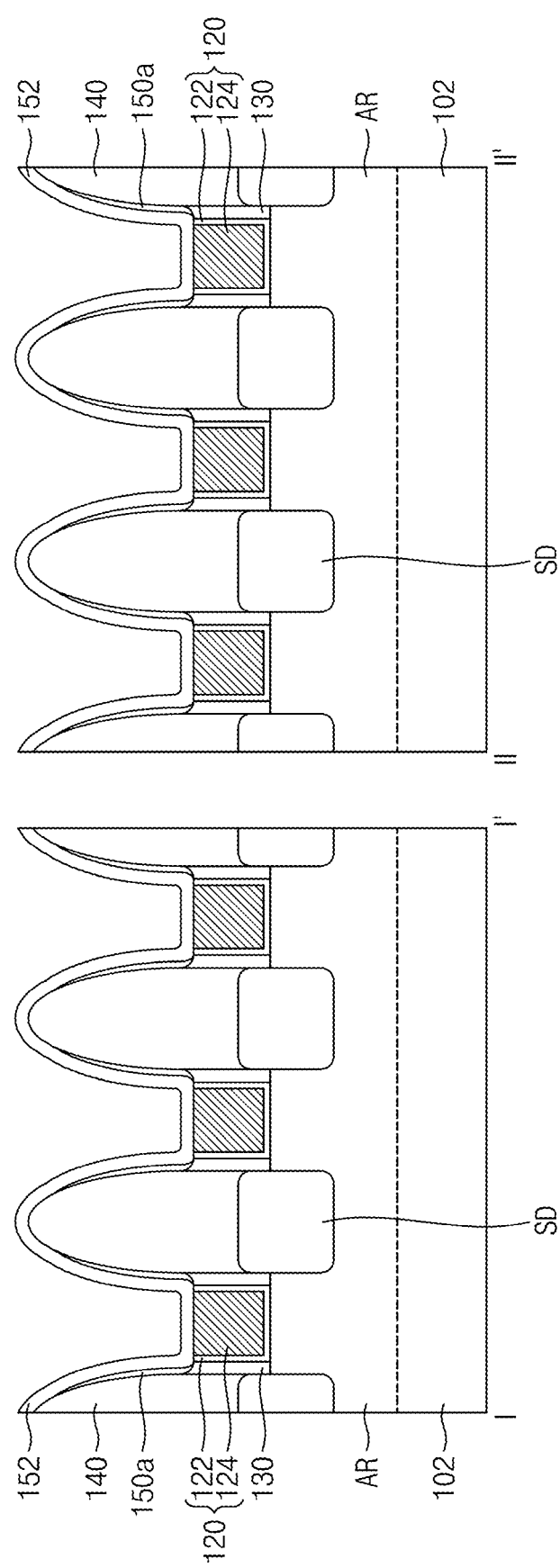
Figure 5B:
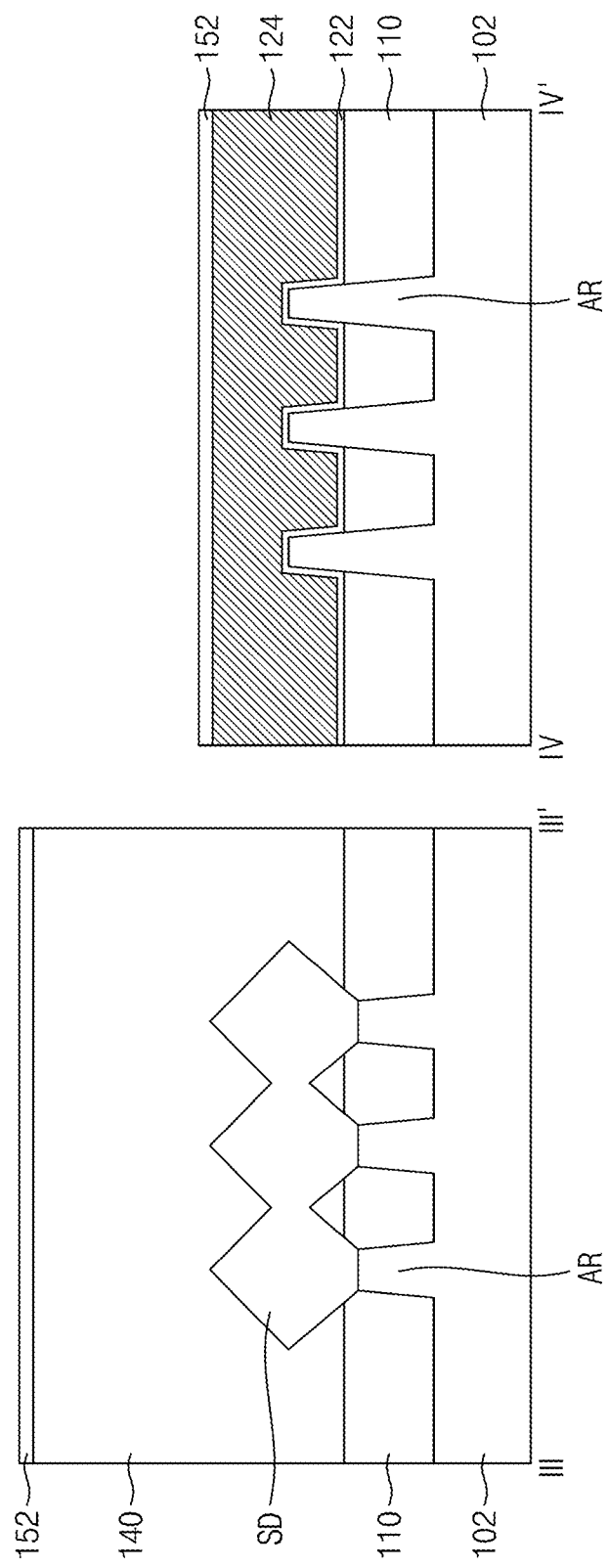

Referring to FIGS. 5A and 5B, the gate structures 120 and the gate spacers 130 may be recessed. That is, the gate capping layer 126 may be removed and, as such, the gate insulating layer 122 and the gate electrode 124 may be exposed. An upper surface of each gate spacer 310, which is recessed, may not be flat. As described with reference to FIG. 3, the height of the gate spacer 130 may be gradually reduced as the upper surface of the gate spacer 130 becomes nearer to the corresponding gate structure 120. The interlayer insulating layer 140 may not be removed, and may protrude upwards beyond the gate structures 120.

An upper spacer 150a and an etch stop layer 152 may be formed on the recessed gate structures 120 and the interlayer insulating layer 140. The upper spacer 150a may be formed by conformally depositing an insulating material along upper surfaces of the gate structures 120 and the interlayer insulating layer 140, and anisotropically etching the insulating material such that the gate structures 120 are exposed. For example, the upper spacer 150a may be formed through an etch-back process. The upper spacer 150a may contact the upper surfaces of the gate spacers 130 while partially covering a side surface of the interlayer insulating layer 140. In an embodiment, the upper spacer 150a may include, e.g., silicon nitride.

The etch stop layer 152 may be formed by conformally depositing an insulating material on the gate structures 120, the interlayer insulating layer 140 and the upper spacer 150a after formation of the upper spacer 150a. The etch stop layer 152 may cover the gate structures 120 and the interlayer insulating layer 140. The etch stop layer 152 may include, e.g., silicon oxycarbide (SiOC) or silicon carbide (SiC). In an embodiment, the etch stop layer 152 may include silicon carbide.

Figure 6A:
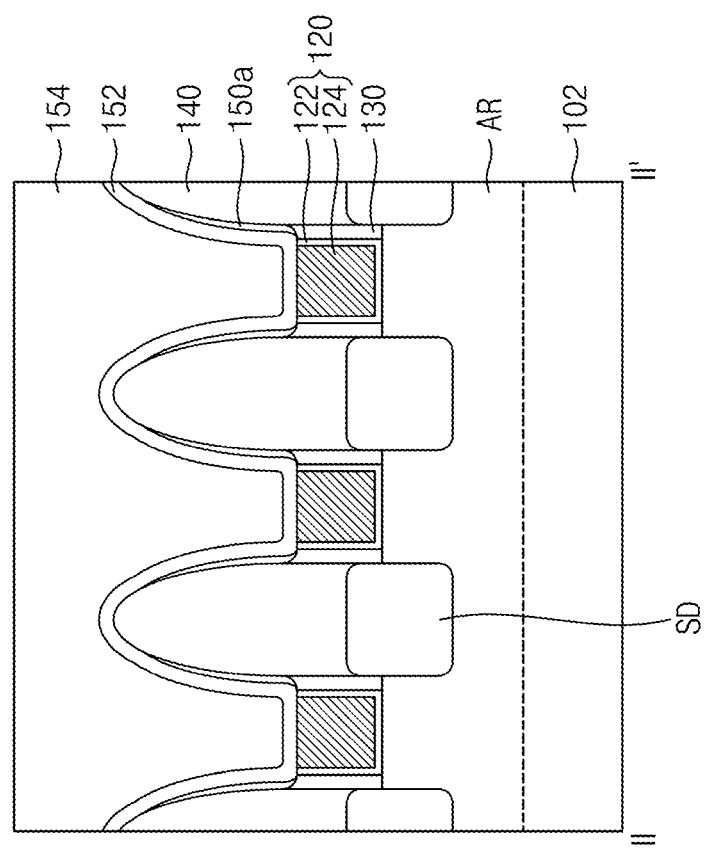
Figure 6A:
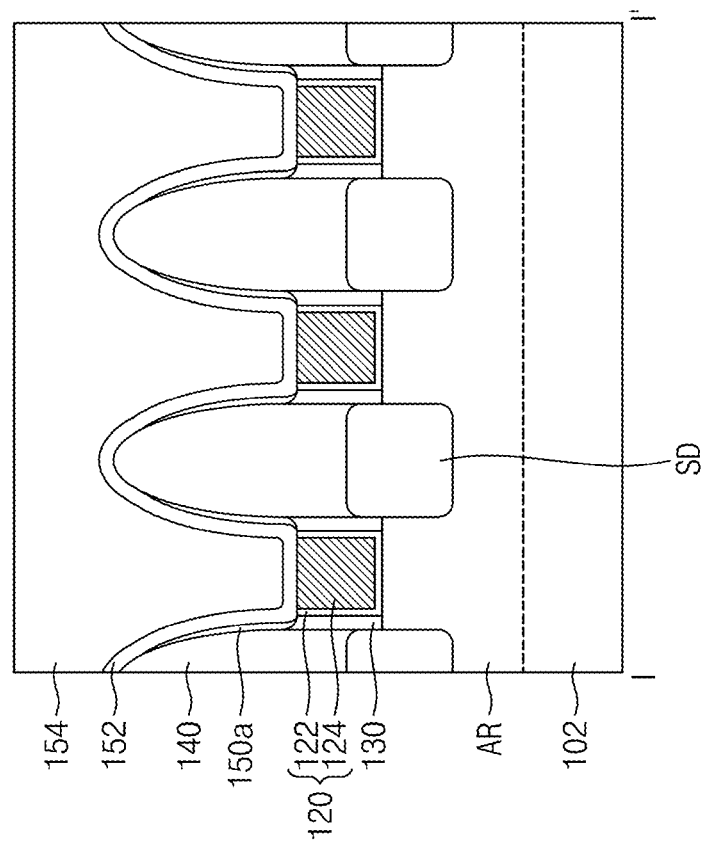
Figure 6B:
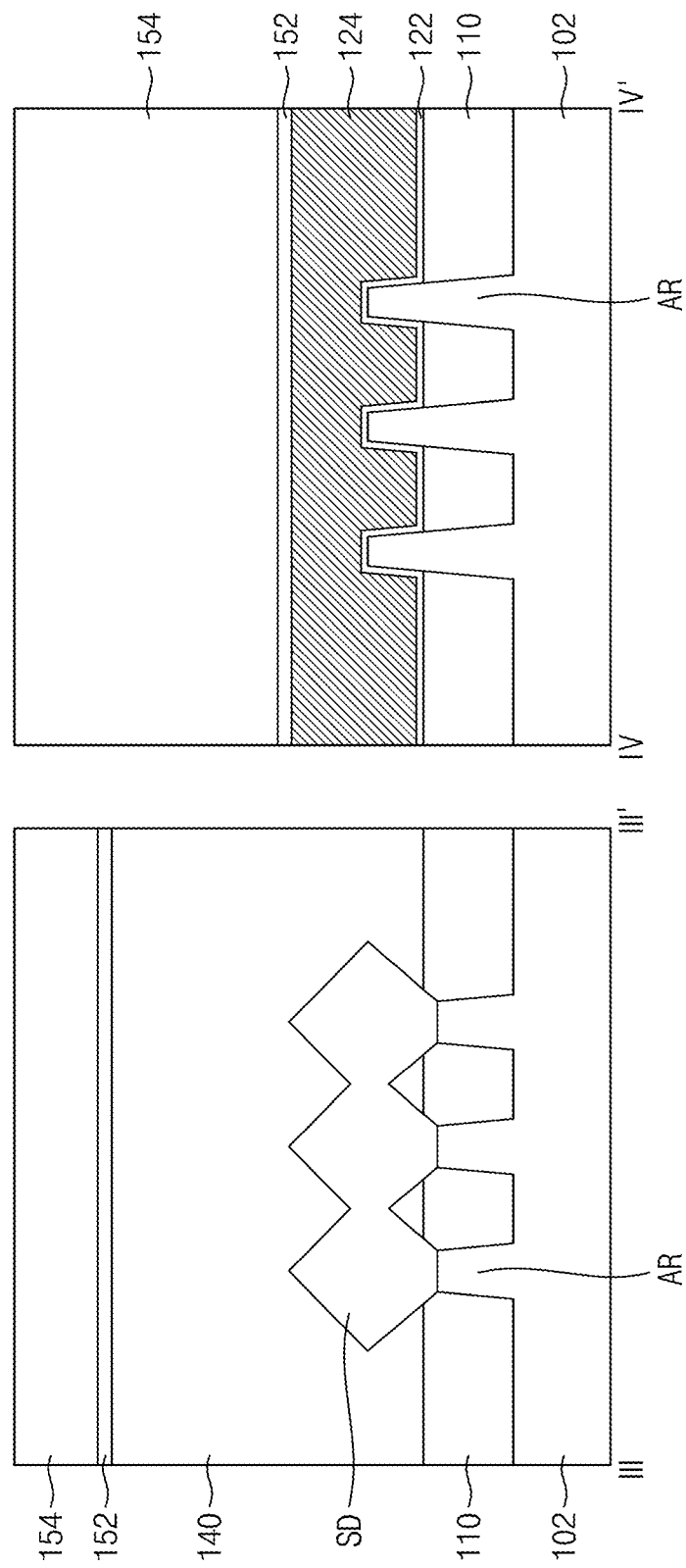

Referring to FIGS. 6A and 6B, an insulating layer 154 may be deposited on the etch stop layer 152. The insulating layer 154 may include, e.g., silicon oxide, silicon nitride, silicon oxynitride, or a combination thereof. In an embodiment, the insulating layer 154 may include silicon oxide.

Figure 7A:
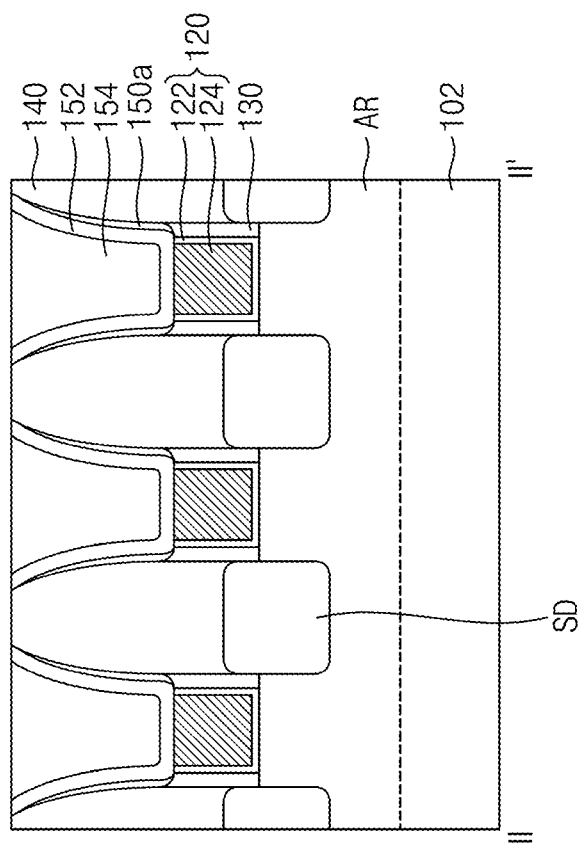
Figure 7A:
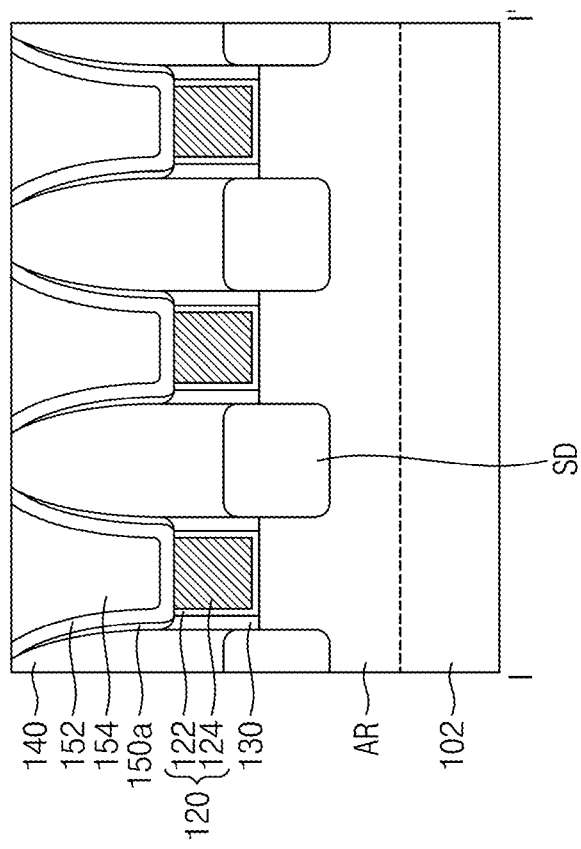
Figure 7B:
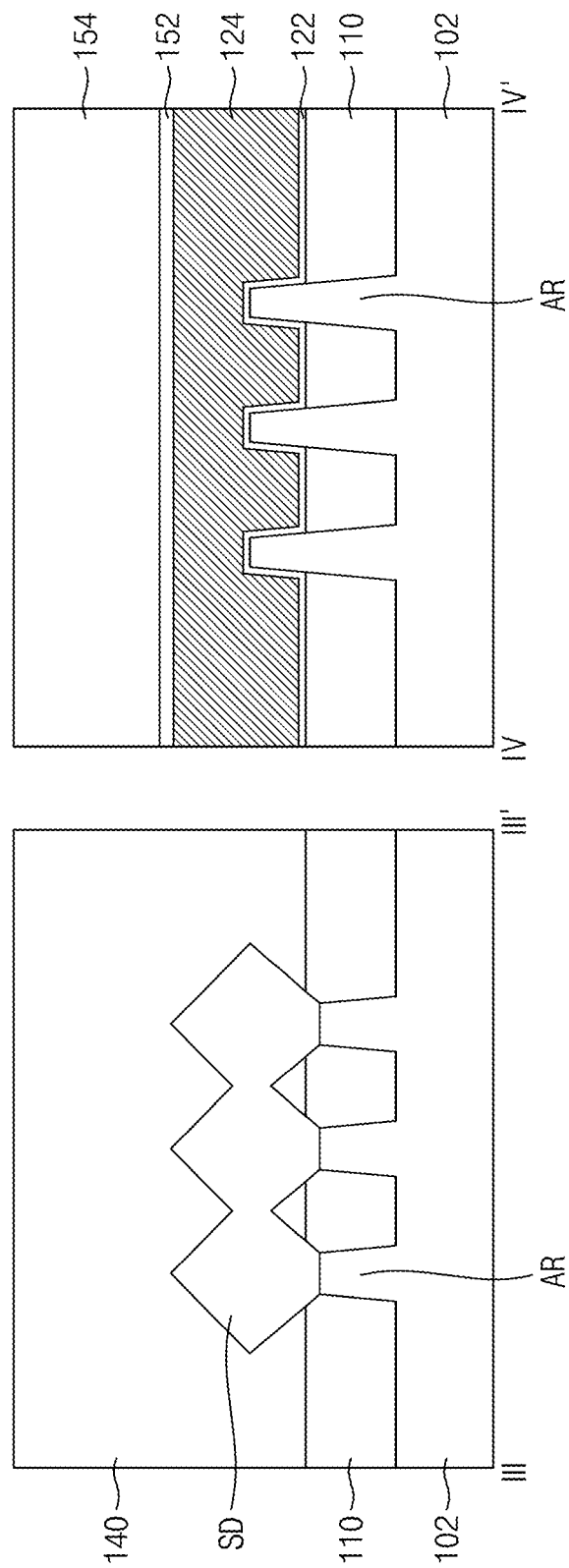

Referring to FIGS. 7A and 7B, a planarization process may be performed to expose the upper surface of the interlayer insulating layer 140. The interlayer insulating layer 140 and the etch stop layer 152 may be partially removed by the planarization process. The planarized etch stop layer 152 may cover the upper surfaces of the gate structures 120 and a side surface of the upper spacer 150a. The insulating layer 154 may be disposed on the etch stop layer 152, and an upper surface of the insulating layer 154 may be coplanar with the upper surface of the interlayer insulating layer 140.

Figure 8A:
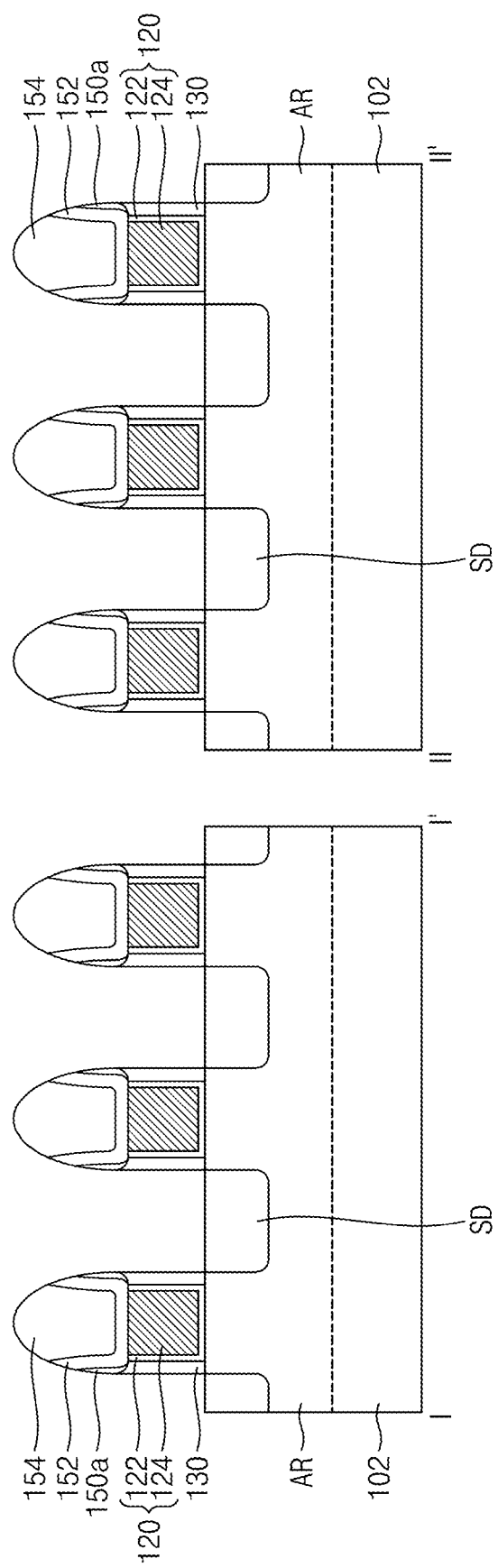
Figure 8B:
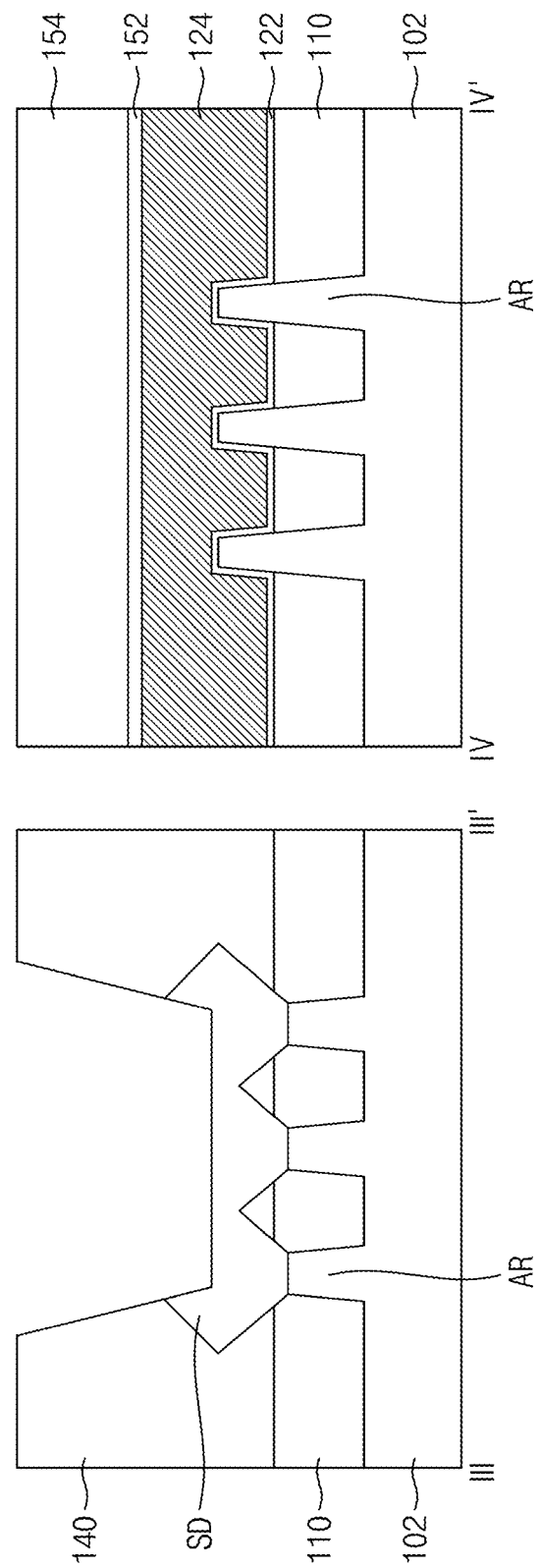

Referring to FIGS. 8A and 8B, portions of the interlayer insulating layer 140 among the gate structures 120 may be anisotropically etched. Etching of the interlayer insulating layer 140 may include forming a hard mask on the resultant structure of FIGS. 7A and 7B, patterning the hard mask such that the interlayer insulating layer 140 is exposed, and etching the exposed interlayer insulating layer 140. The etching process may include a dry etching process. In accordance with the etching process, the source/drain regions SD may be exposed. In an embodiment, upper portions of the source/drain regions SD may be partially removed. The upper spacer 150a, the etch stop layer 152 and the insulating layer 154 may also be partially removed. The upper spacer 150a may protect the gate structures 120 during the etching process such that the gate structures 120 may be prevented from being etched.

Figure 9A:
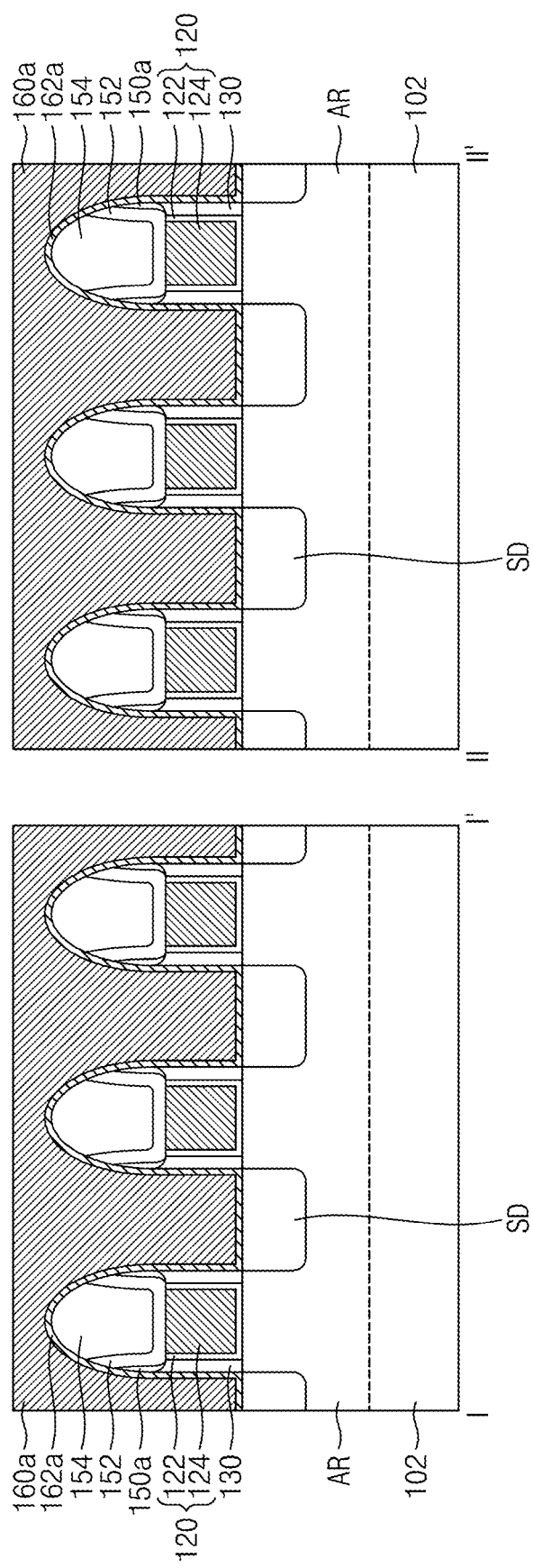
Figure 9B:
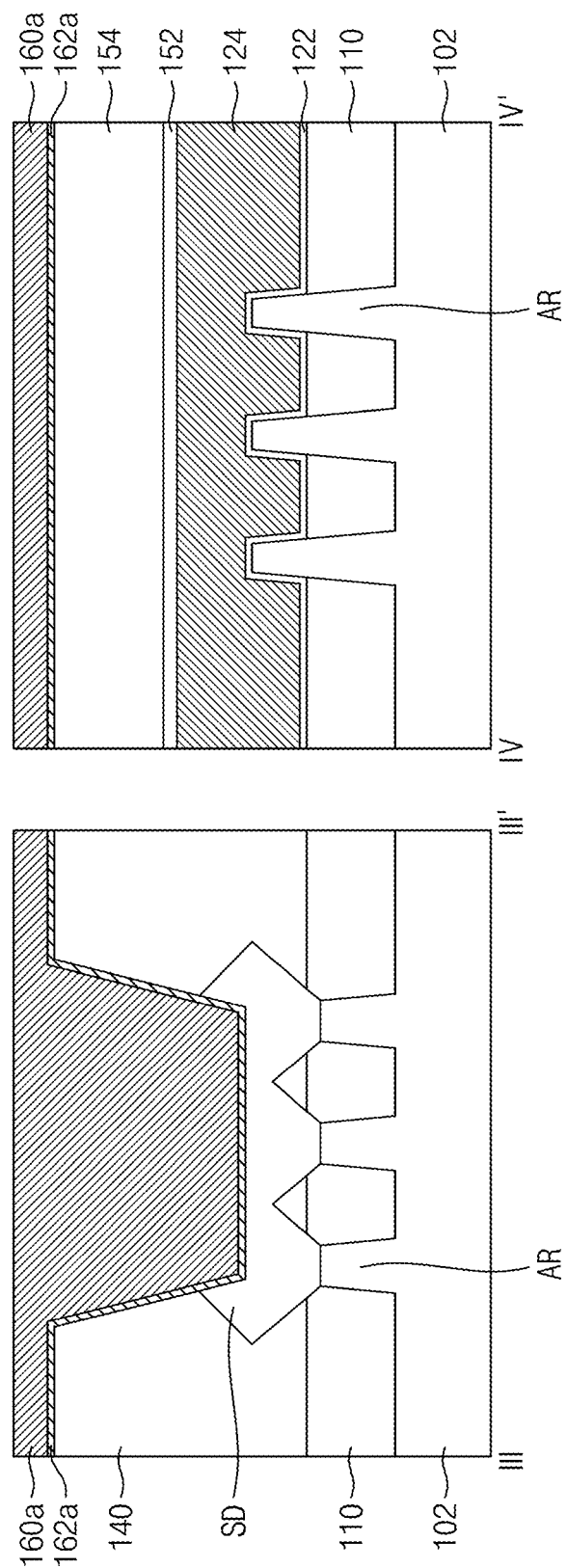

Referring to FIGS. 9A and 9B, a conductive material 160a and a barrier material 162a may be deposited on the resultant structure of FIGS. 8A and 8B. The barrier material 162a may be conformally formed along surfaces of the source/drain regions SD, the gate structures 120, the interlayer insulating layer 140, the upper spacer 150a, the etch stop layer 152, and the insulating layer 154. The conductive material 160a may be formed on the barrier material 162a, and may fill a space among the gate structures 120. The conductive material 160a may include, e.g., W, Co, Ru, Mo, or a combination thereof. The barrier material 162a may include, e.g., Ti, TiN, Ta, TaN, or a combination thereof.

Figure 10A:
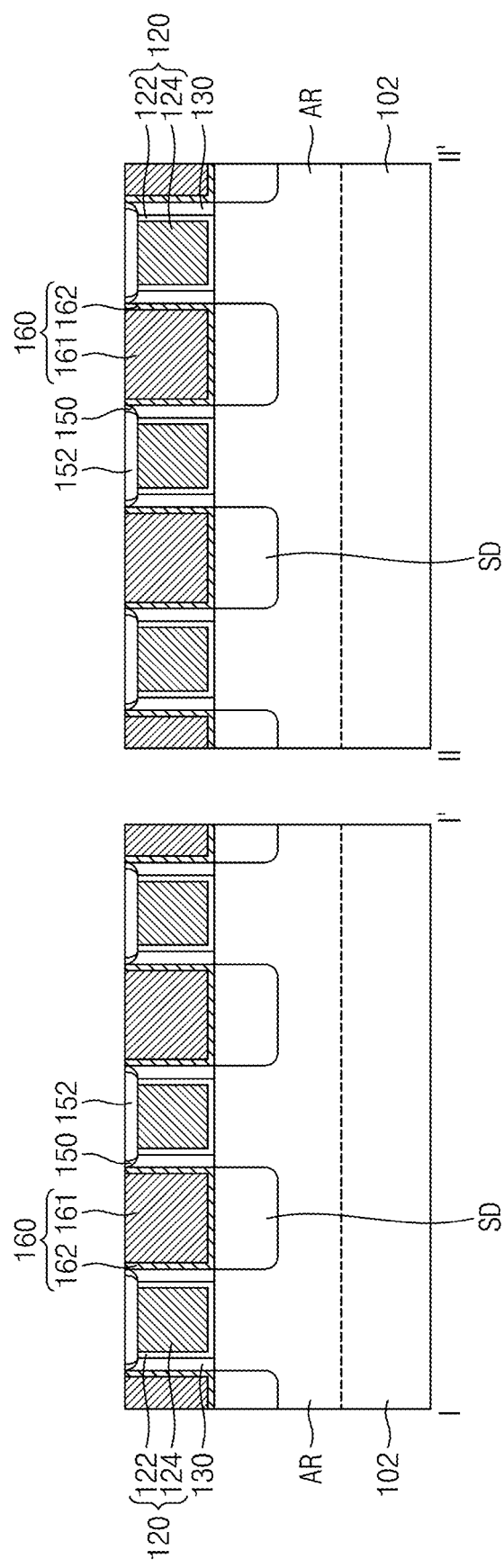
Figure 10B:
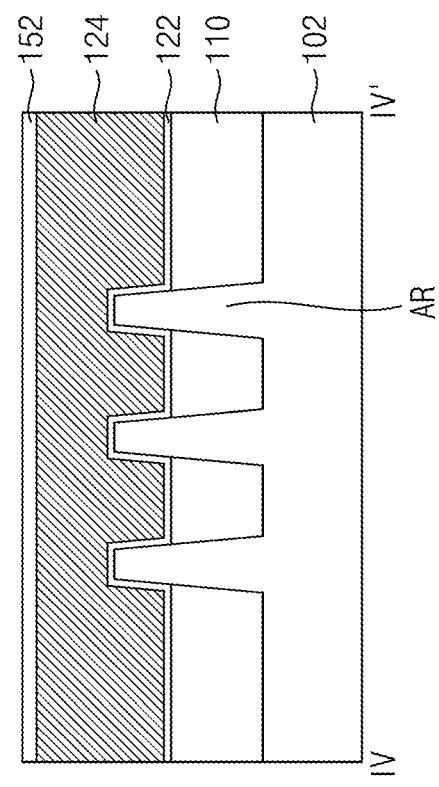
Figure 10B:
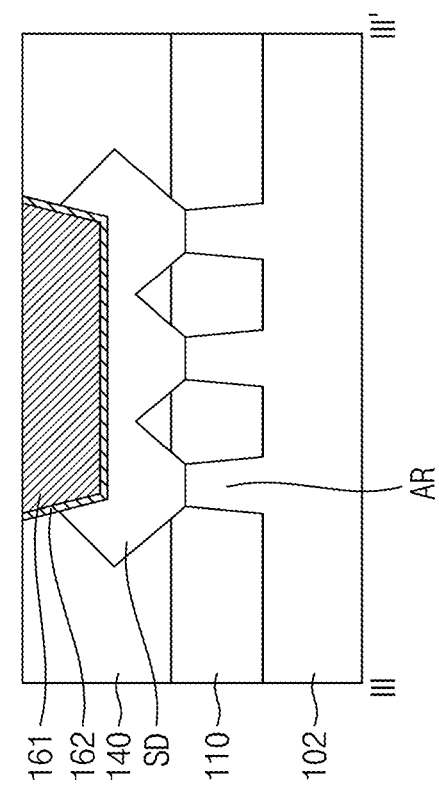

Referring to FIGS. 10A and 10B, a planarization process may be performed to remove the insulating layer 154. The etch stop layer 152 may protect the gate structures 120 during the planarization process such that the gate structures 120 may be prevented from being etched. In the planarization process, the conductive material 160a and the barrier material 162a may be etched, thereby forming lower source/drain contact conductive layers 161 and lower contact barrier layers 162. The lower source/drain contact conductive layers 161 and the lower contact barrier layers 162 may constitute the lower source/drain contact plugs 160. The lower source/drain contact plugs 160 may be horizontally spaced apart from one another, and may be disposed at opposite sides of the gate structures 120. Upper spacers 150 may be formed as the upper spacer 150a is etched through the planarization process. Upper surfaces of the lower source/drain contact plugs 160 may be coplanar with the upper surface of the interlayer insulating layer 140, upper surfaces of the upper spacers 150, and an upper surface of the etch stop layer 152.

Figure 11A:
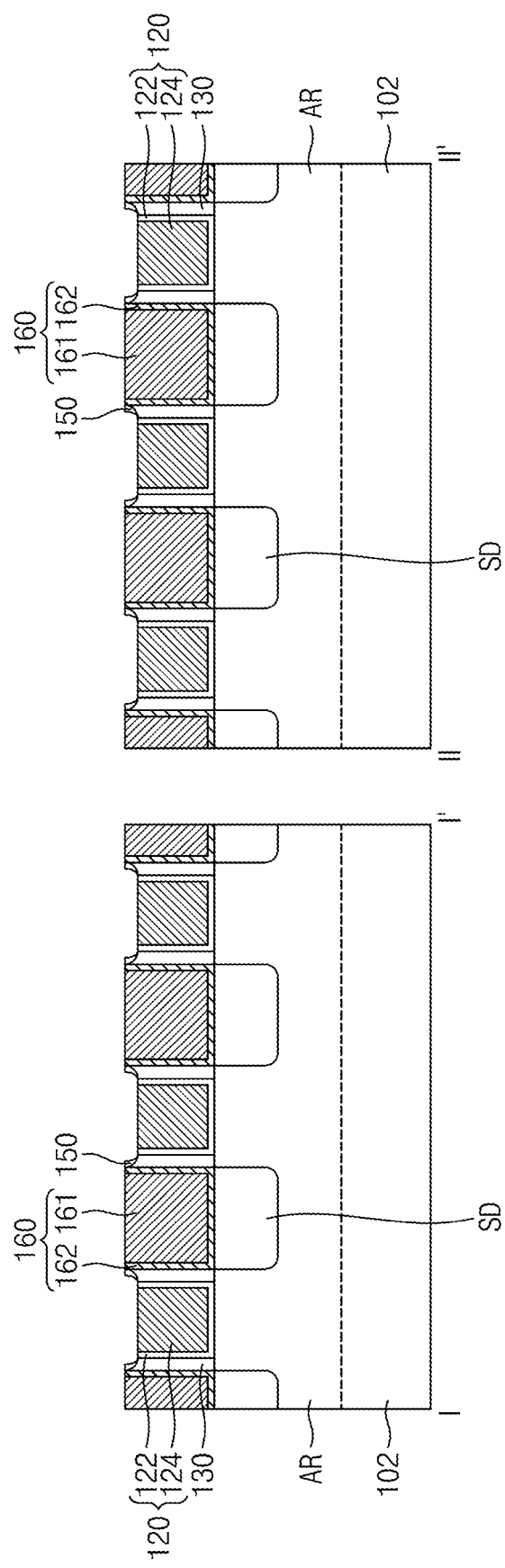
Figure 11B:
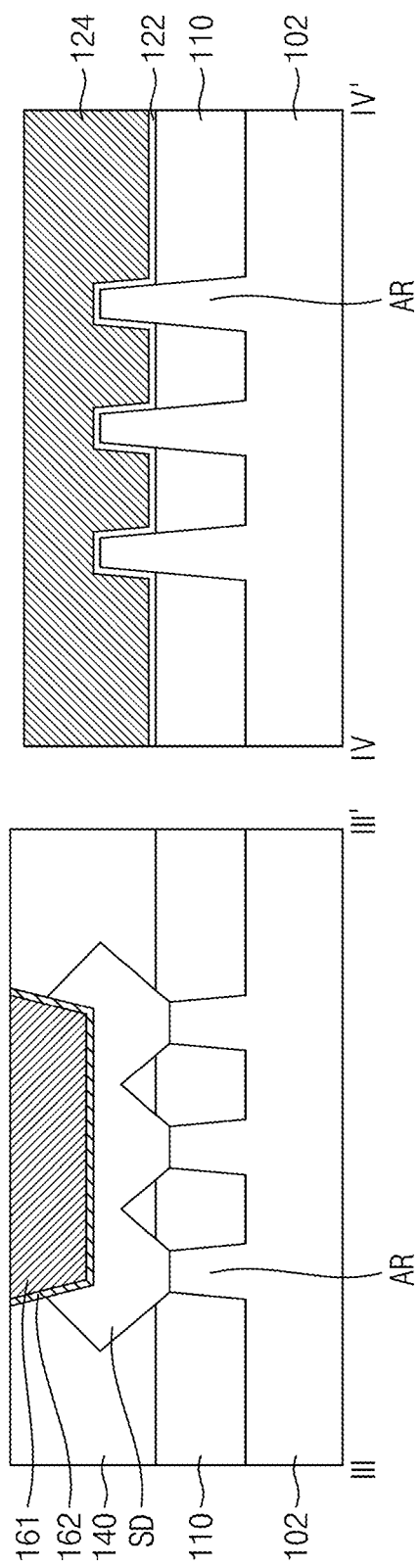

Referring to FIGS. 11A and 11B, the etch stop layer 152 may be removed, thereby exposing the gate structures 120. Removal of the etch stop layer 152 may include performing an ashing process. The etch stop layer 152 may be selectively removed, and the upper spacers 150 and the lower source/drain contact plugs 160 may not be etched. The upper surfaces of the gate structures 120 may be disposed at a lower level than the upper surfaces of the upper spacers 150 and the lower source/drain contact plugs 160.

Figure 12A:
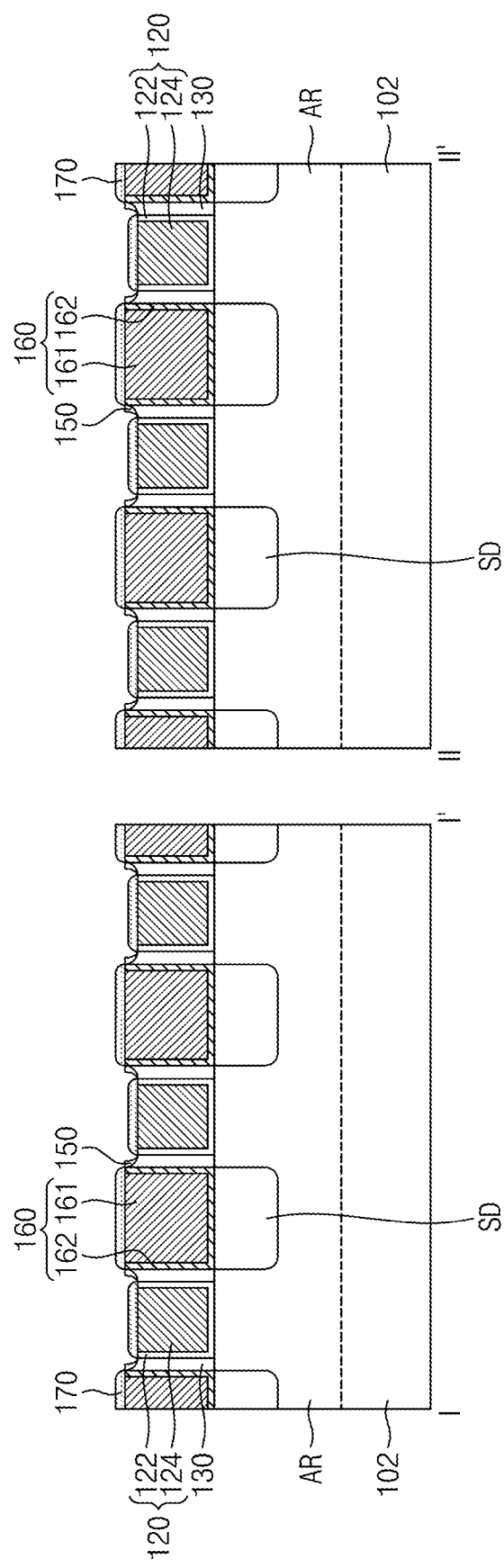
Figure 12B:
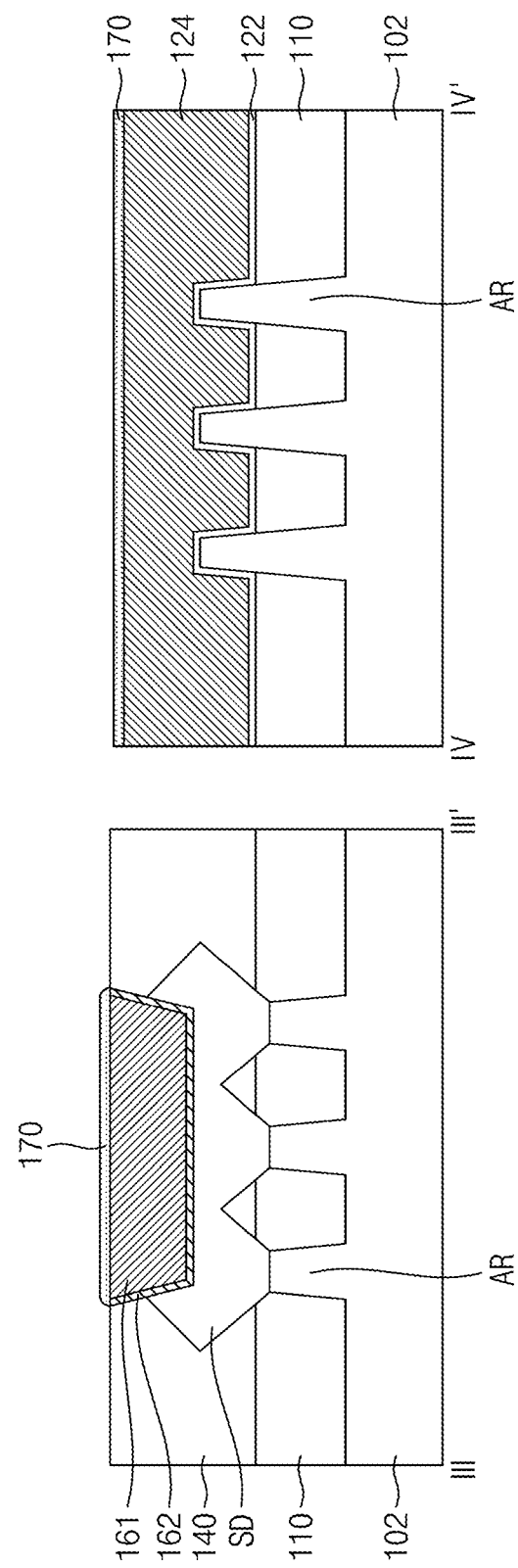

Referring to FIGS. 12A and 12B, suppressants 170 may be selectively formed on the resultant structure of FIGS. 11A and 11B. For example, the suppressants 170 may cover the gate structures 120 and the lower source/drain contact plugs 160, but may not cover the interlayer insulating layer 140 and the upper spacers 150. In an embodiment, the suppressants 170 may incompletely cover the gate structures 120 and the lower source/drain contact plugs 160 and, as such, the gate structures 120 and the lower source/drain contact plugs 160 may be partially exposed. In an embodiment, the suppressants 170 may include polymer.

Figure 13A:
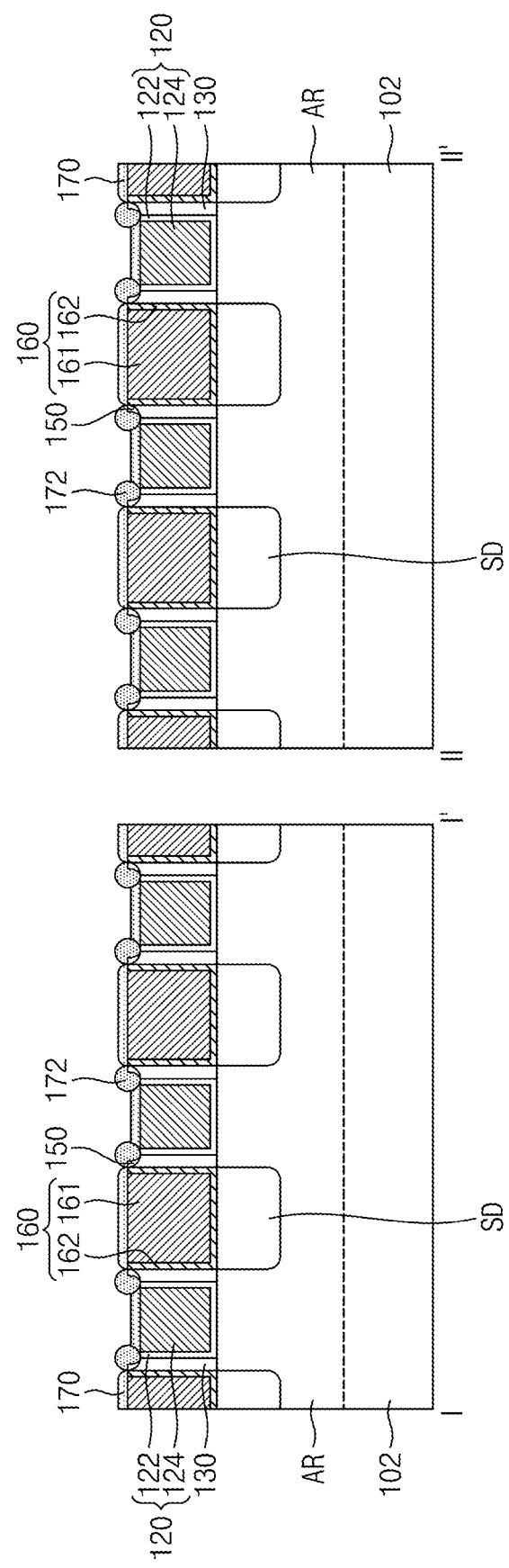
Figure 13B:
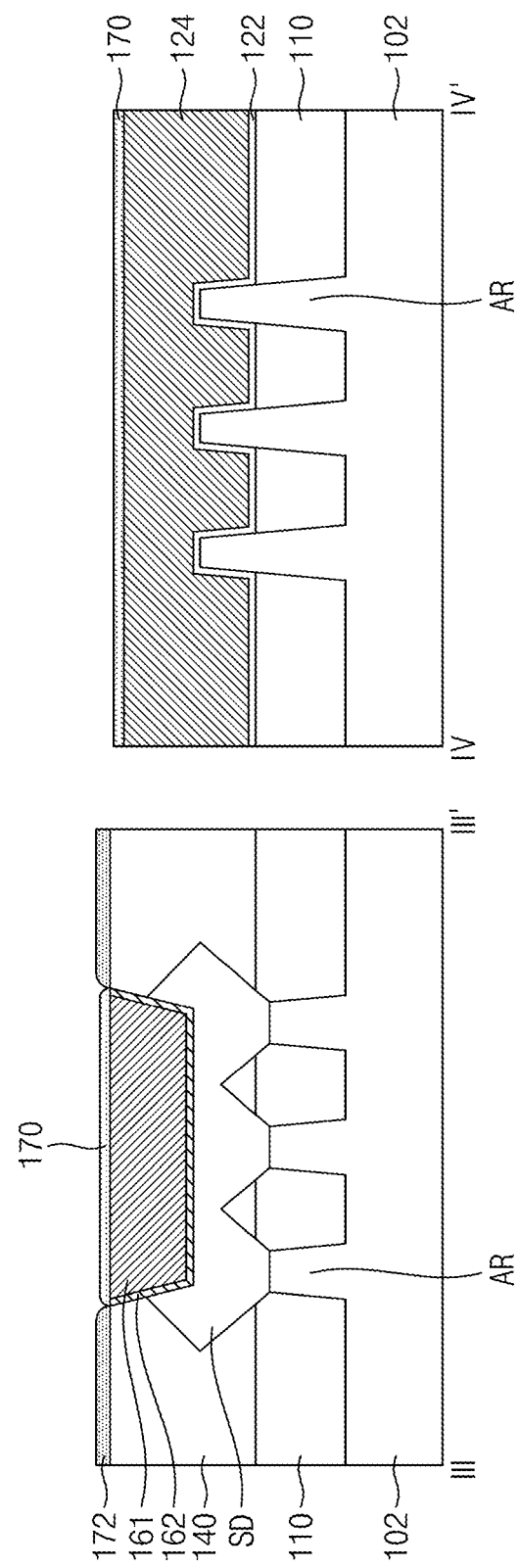

Referring to FIGS. 13A and 13B, the gate isolation layers 172 may be selectively formed on the upper spacers 150. For example, the gate isolation layers 172 may be formed through upward growth thereof from surfaces of the upper spacers 150, e.g., each gate isolation layer 172 may be grown from a corresponding upper spacer 150 to contact facing corners of a corresponding gate structure 120 and an adjacent lower source/drain contact plug 160. The gate isolation layers 172 may have a round cross-section. In addition, the gate isolation layers 172 may be formed on the upper surface of the interlayer insulating layer 140. In an embodiment, formation of the gate isolation layers 172 may include performing an atomic layer deposition (ALD) process. The gate isolation layers 172 may include, e.g., silicon oxide, silicon nitride, aluminum oxide, or a combination thereof.

Figure 14A:
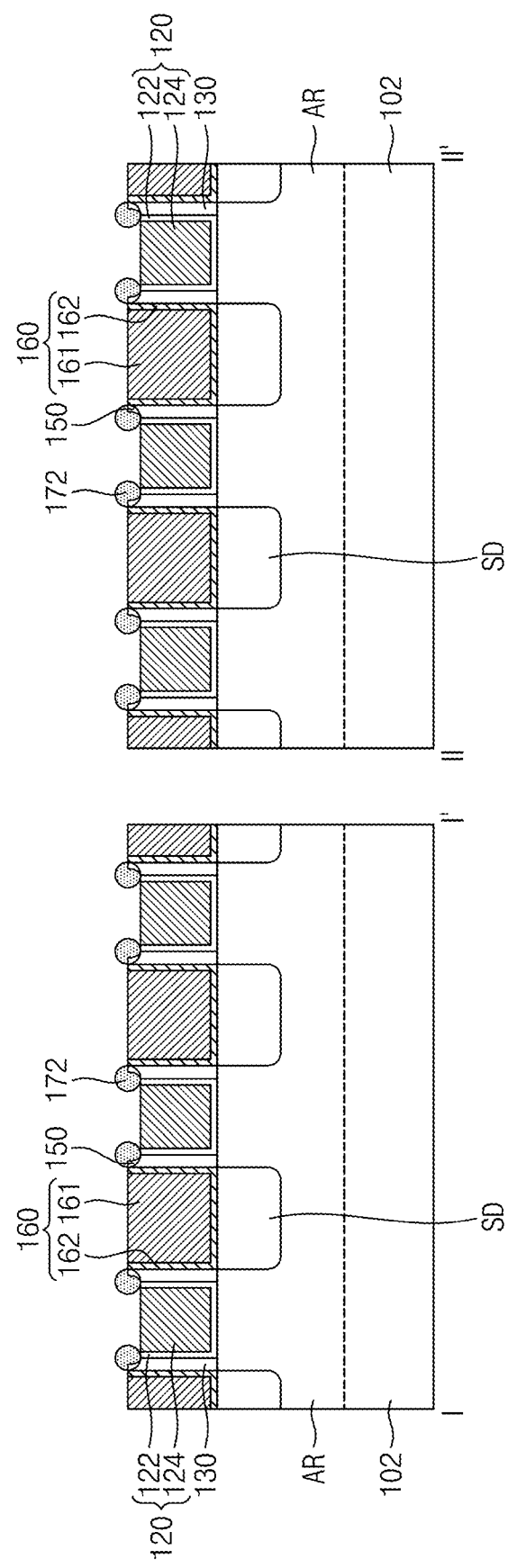
Figure 14B:
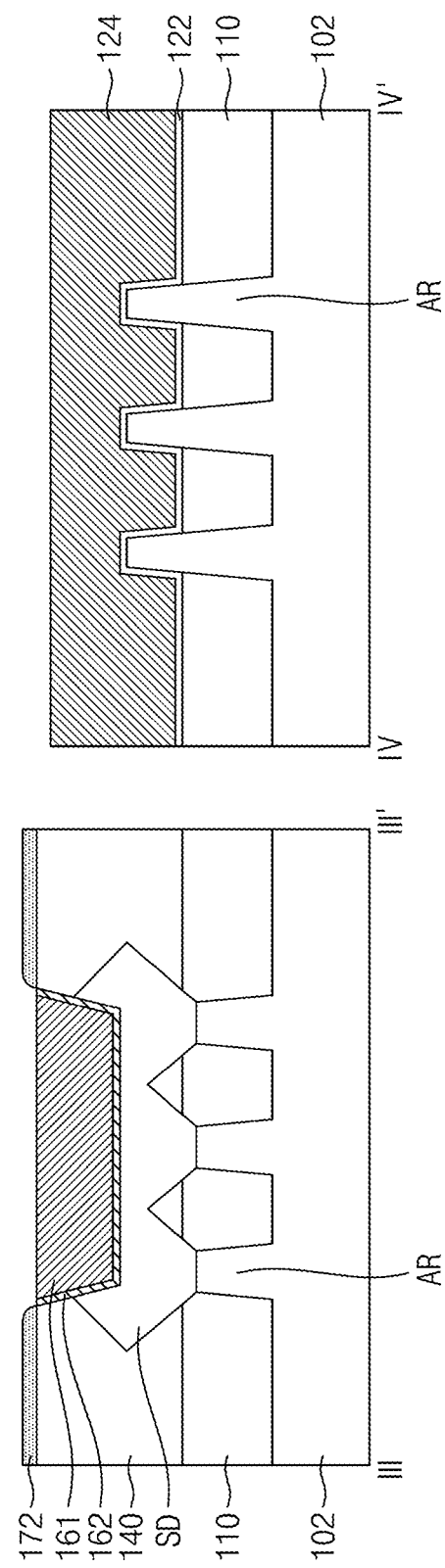

Referring to FIGS. 14A and 14B, the suppressants 170 may be selectively removed and, as such, the gate structures 120 and the lower source/drain contact plugs 160 may be exposed. In an embodiment, the suppressants 170 may remain on the upper surfaces of the gate structures 120 or the upper surfaces of the lower source/drain contact plugs 160 without being completely removed.

Figure 15A:
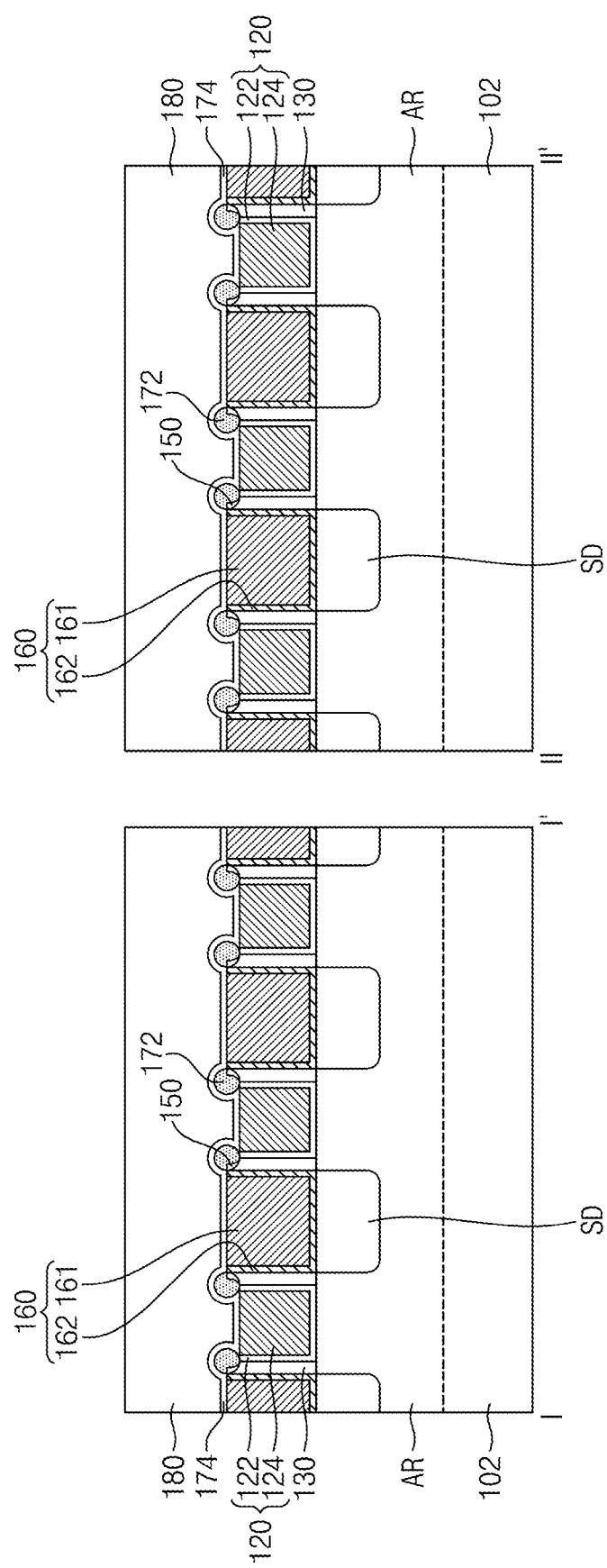
Figure 15B:
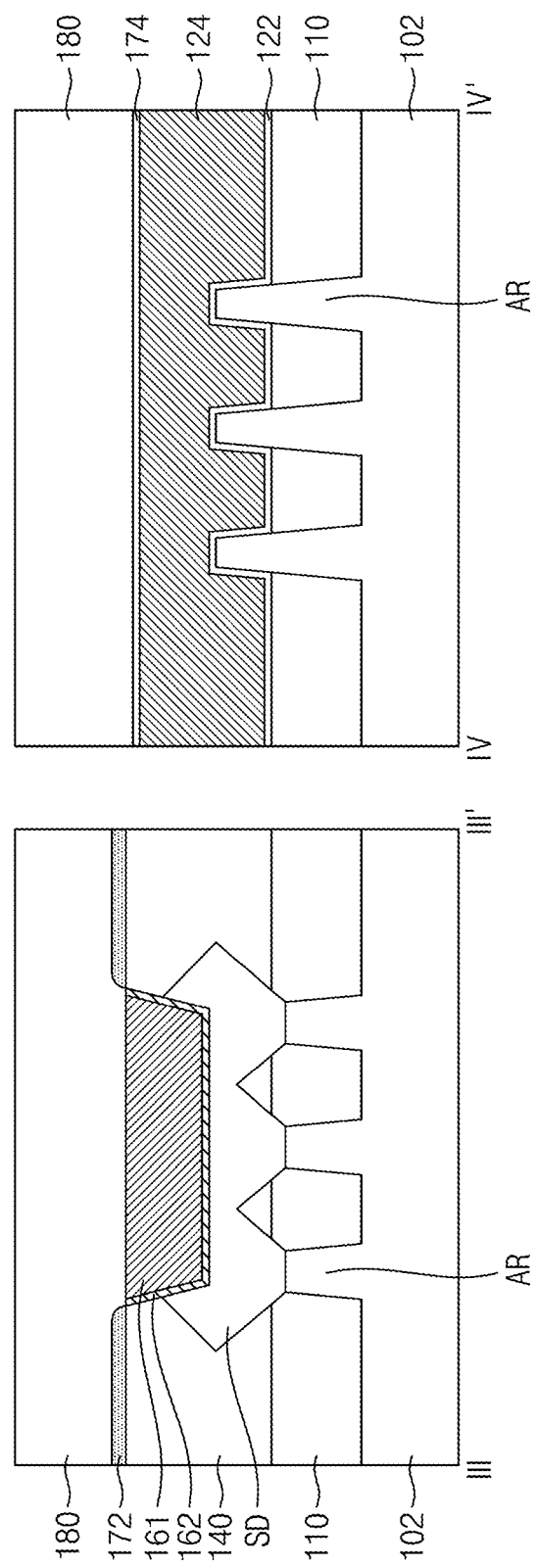

Referring to FIGS. 15A and 15B, the capping layer 174 and the upper insulating layer 180 may be formed on the resultant structure of FIGS. 14A and 14B. Formation of the capping layer 174 may include performing a chemical vapor deposition (CVD) process or an ALD process. The capping layer 174 may be conformally disposed along the upper surfaces of the gate structures 120 and the lower source/drain contact plugs 160 and upper surfaces of the gate isolation layers 172. In an embodiment, the capping layer 174 may include silicon nitride.

The upper insulating layer 180 may be formed on the capping layer 174. The upper insulating layer 180 may be deposited through, e.g., a CVD process or an ALD process. In an embodiment, the upper insulating layer 180 may include, e.g., silicon oxide, silicon nitride, silicon oxynitride, or a low-k dielectric material.

Figure 16A:
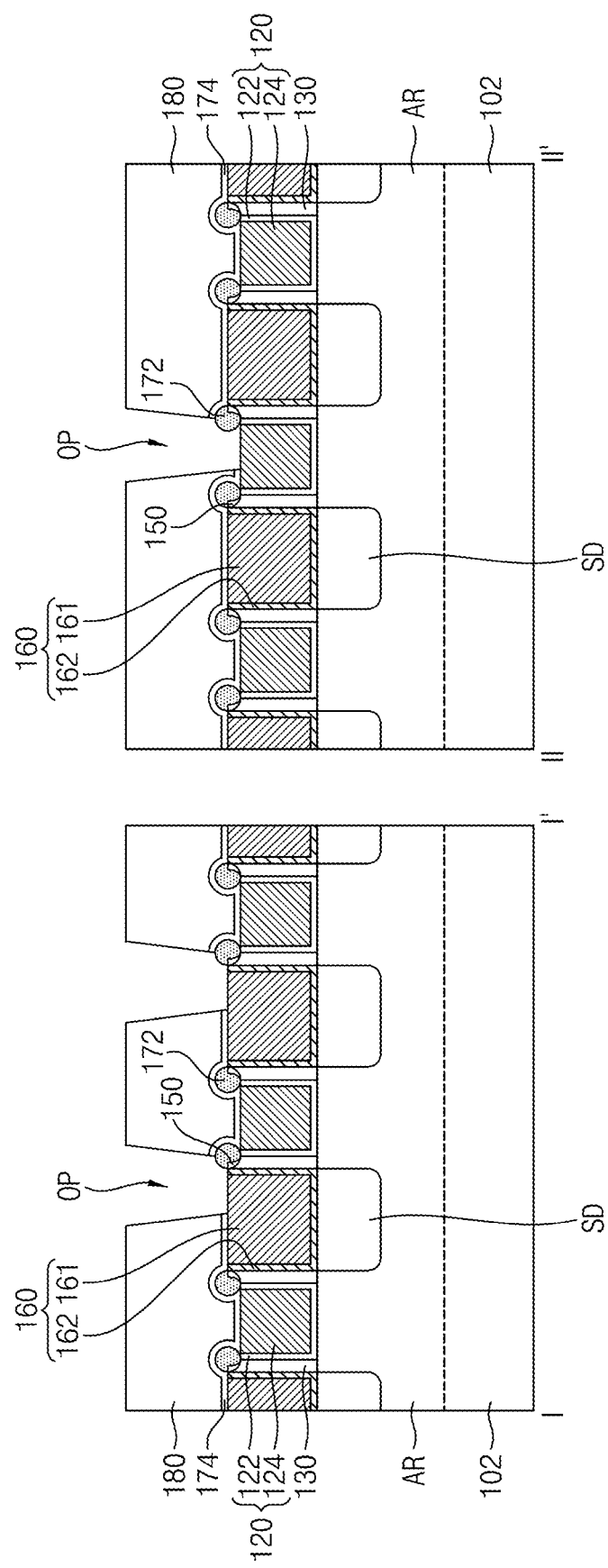
Figure 16B:
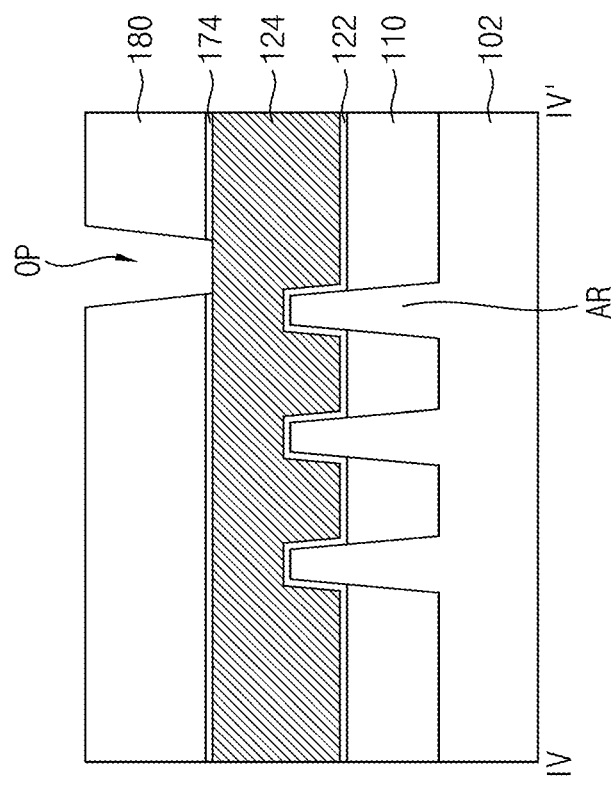
Figure 16B:
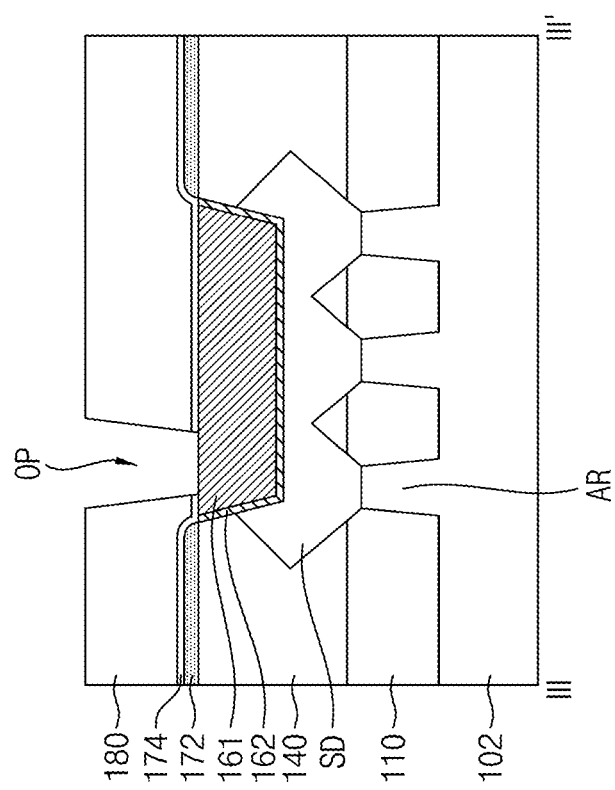

Referring to FIGS. 16A and 16B, openings OP may be formed to expose the gate structures 120 and the lower source/drain contact plugs 160 therethrough. Formation of the openings OP may include anisotropically etching the capping layer 174 and the upper interlayer insulating layer 140. In an embodiment, the gate structures 120 and the lower source/drain contact plugs 160 may be partially etched through the etching process.

In an embodiment, the openings OP may be vertically misaligned relative to the gate structures 120 or the lower source/drain contact plugs 160 due to process deviation or occurrence of misalignment. The gate isolation layers 172 may be exposed by the etching process. However, the gate isolation layers 172 may have dry etching resistance and, as such, may not be substantially removed by the etching process. Accordingly, the gate isolation layers 172 may prevent adjacent ones of the gate structures 120 and the lower source/drain contact plugs 160 from being simultaneously exposed through one opening OP, e.g., the gate isolation layer 172 may fill (e.g., seal) one bottom corner of each of the openings OP to prevent exposure of a corresponding one of the gate structure 120 or the lower source/drain contact plug 160. For example, the openings OP, which expose the gate structures 120, may not expose the lower source/drain contact plugs 160, and the openings OP, which expose the lower source/drain contact plugs 160, may not expose the gate structures 120.

Referring back to FIGS. 2A and 2B, gate contact plugs 181 contacting the gate structures 120 and upper source/drain contact plugs 184 contacting the lower source/drain contact plugs 160 may be formed in the openings OP. Each of the gate contact plugs 181 may include the gate contact conductive layer 182 and the gate barrier layer 183, and each of the upper source/drain contact plugs 184 may include the upper source/drain contact conductive layer 185 and the upper contact barrier layer 186. The gate contact plugs 181 and the upper source/drain contact plugs 184 may be formed by forming a barrier material and a conductive material in the openings OP and on the upper insulating layer 180, and performing a planarization process such that the barrier material and the conductive material may be coplanar with the upper insulating layer 180. The gate contact plugs 181 may be formed in the same formation process as the upper source/drain contact plugs 184 and, as such, the gate contact conductive layer 182 may include the same material as the upper source/drain contact conductive layer 185, and the gate barrier layer 183 may include the same material as the upper contact barrier layer 186.

The gate contact conductive layer 182 and the upper source/drain contact conductive layer 185 may include, e.g., W, Co, Ru, Mo, or a combination thereof. The gate barrier layer 183 and the upper contact barrier layer 186 may include, e.g., Ti, TiN, Ta, TaN, or a combination thereof.

Since the gate isolation layers 172 are not etched in the process of forming the openings OP, as described above, the gate contact plugs 181 may not be electrically connected to the lower source/drain contact plugs 160, and the upper source/drain contact plugs 184 may not be electrically connected to the gate structures 120, even when misalignment of the openings OP occurs. Accordingly, it may be possible to reduce failure, e.g., an electrical short circuit, which may occur when contact plugs are formed in a narrow space. As such, it may be possible to enhance the reliability of the semiconductor device 100 while enhancing the integration degree of the semiconductor device 100.

Figure 17:
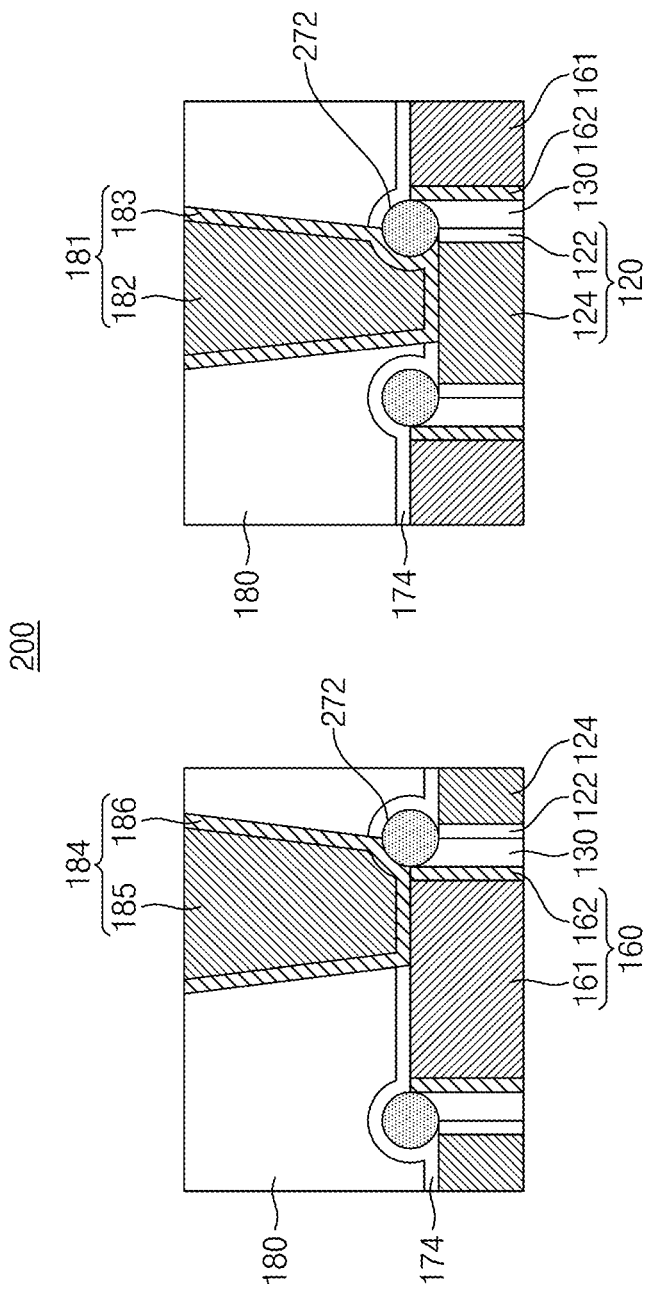
FIGS. 17 to 19 are vertical cross-sectional views of contact plugs in semiconductor devices according to example embodiments.
Figure 18:
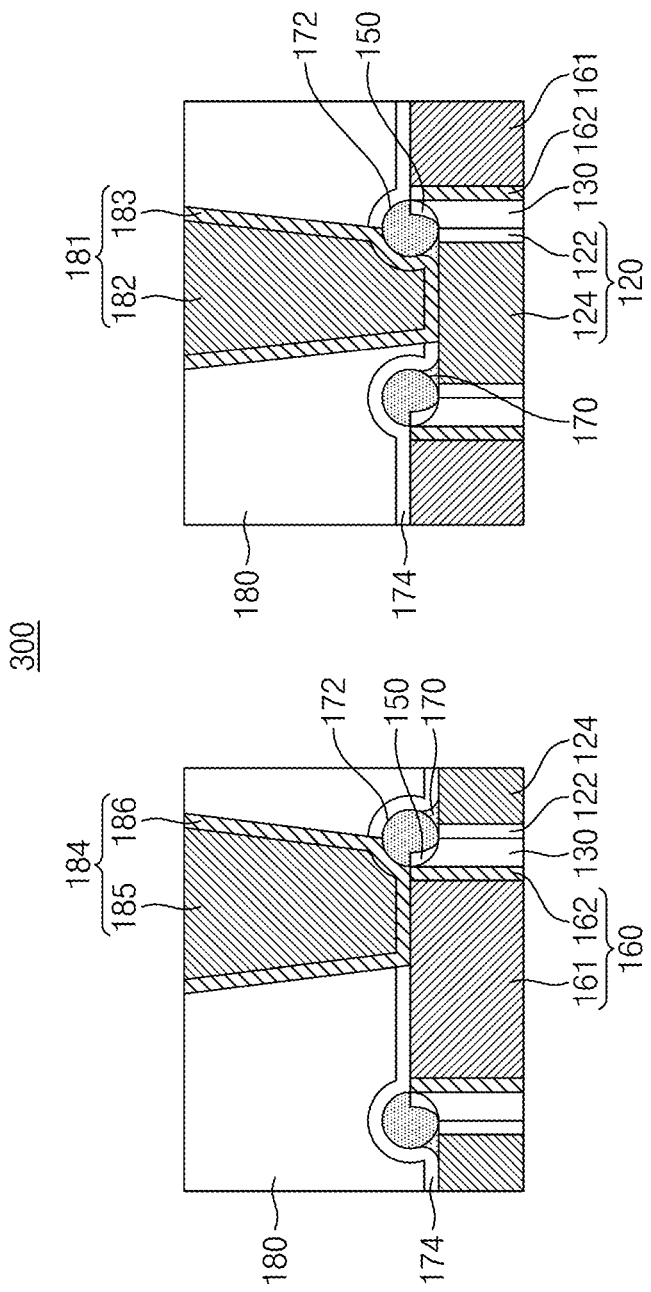
Figure 19:
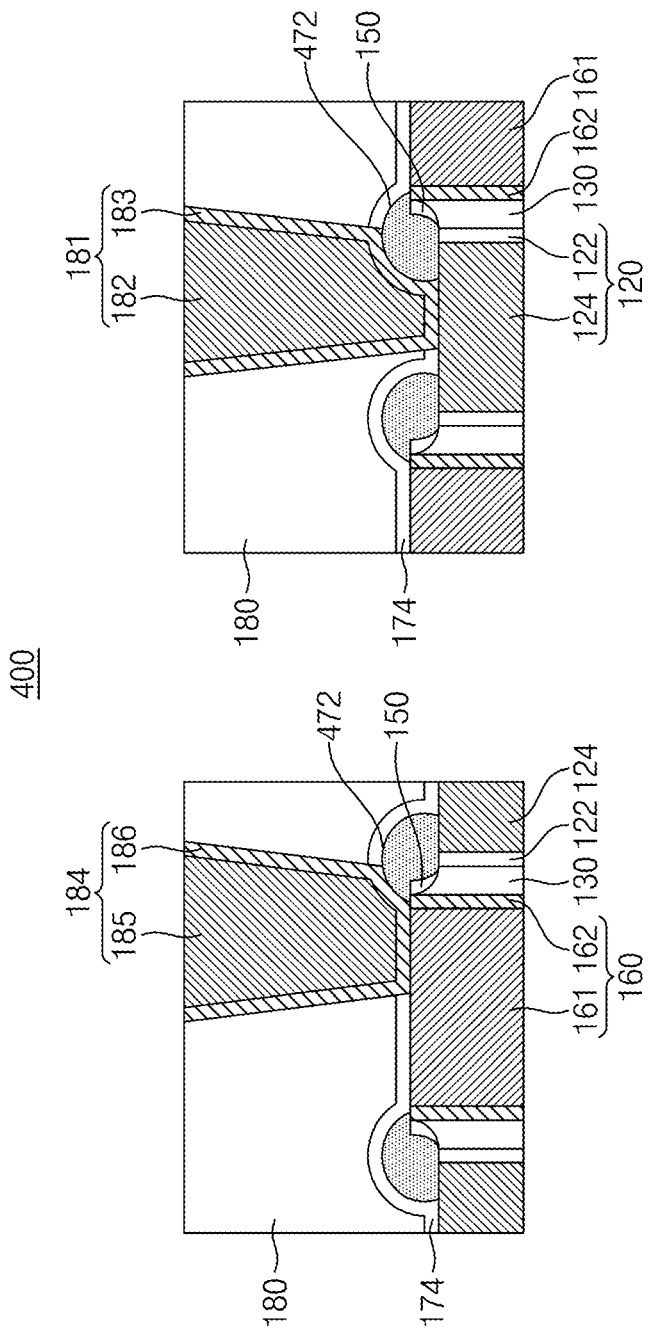

FIGS. 17 to 19 are vertical cross-sectional views of semiconductor devices according to example embodiments.

Referring to FIG. 17, a semiconductor device 200 may include a gate isolation layer 272 contacting an upper surface of the gate spacer 130. The upper spacers 150 of the semiconductor device 100 shown in FIG. 3 may be omitted.

Referring to FIG. 18, a semiconductor device 300 may include a suppressant 170. In a process of removing the suppressant 170, as described with reference to FIGS. 14A and 14B, the suppressant 170 may be incompletely removed. The remaining portion of the suppressant 170 may be disposed on an upper surface of the gate structure 120 or an upper surface of the lower source/drain contact plug 160. For example, as shown in FIG. 18, the remaining portion of the suppressant 170 may be disposed between the gate structure 120 and the gate isolation layer 172.

Referring to FIG. 19, a semiconductor device 400 may include gate isolation layers 472 disposed on the gate spacers 130. The gate isolation layers 472 may partially cover the gate structure 120 and the lower source/drain contact plug 160, but the exemplary embodiments are not limited thereto. The gate isolation layers 472 may partially cover at least one of the gate structure 120 and the lower source/drain contact plug 160.

Figure 20A:
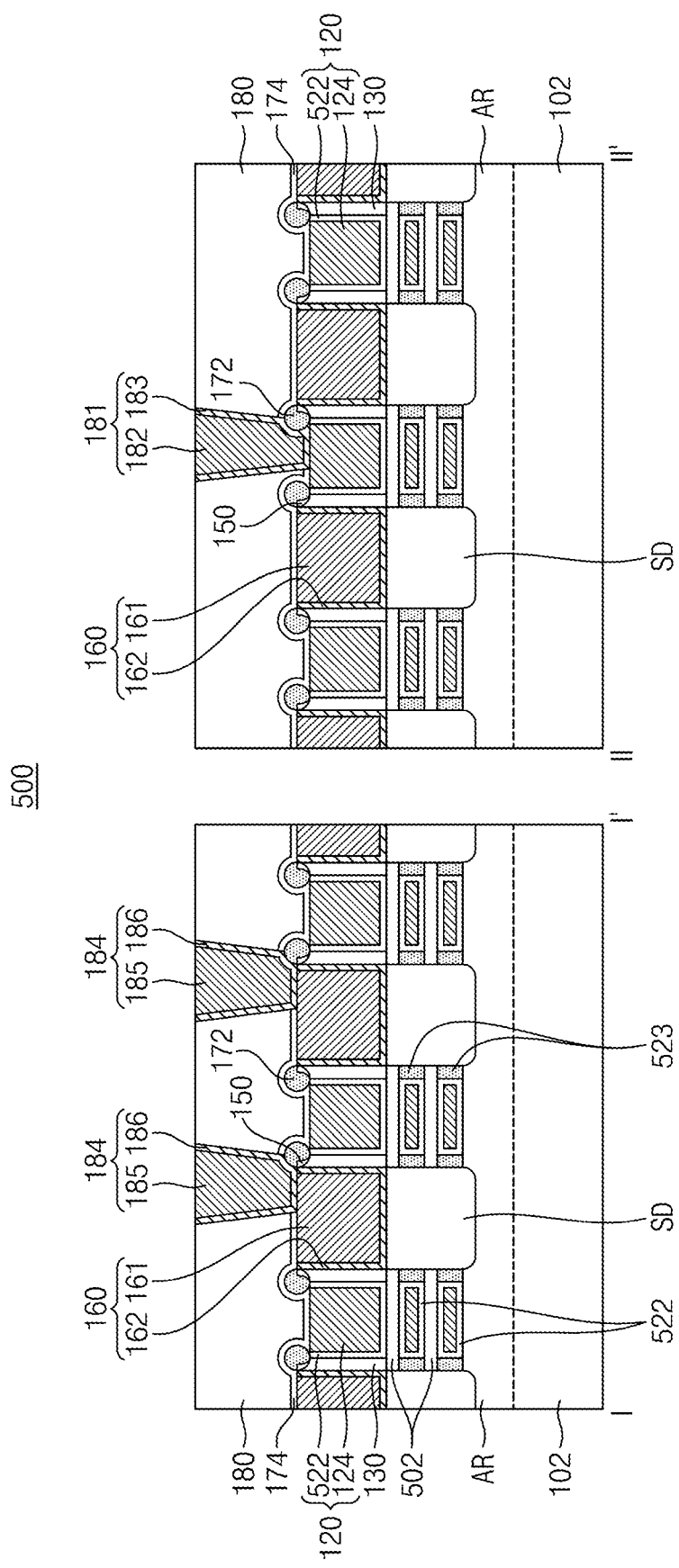
FIGS. 20A and 20B are vertical cross-sectional views of a semiconductor device according to an example embodiment.
Figure 20B:
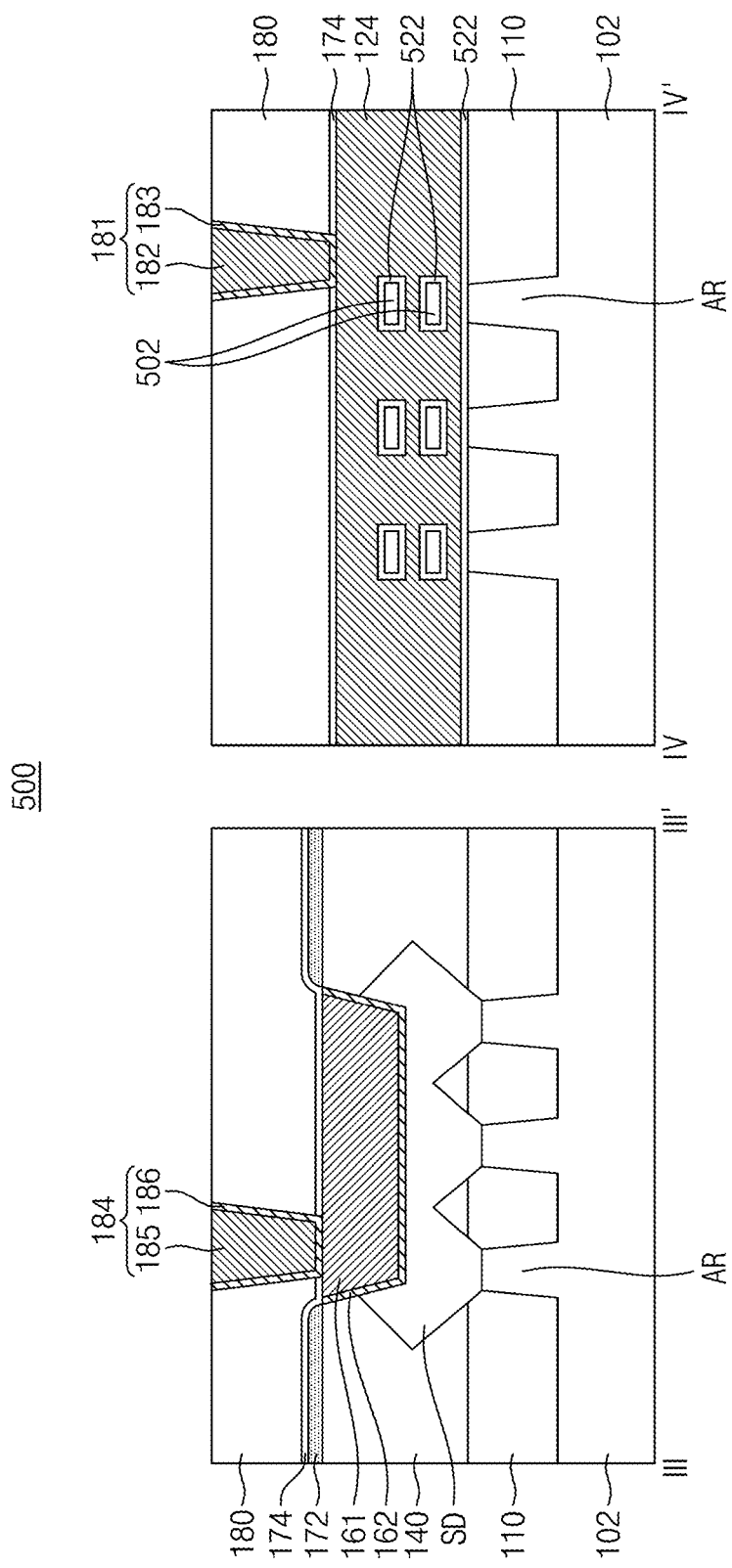

FIGS. 20A and 20B are vertical cross-sectional views of a semiconductor device according to an example embodiment.

Referring to FIGS. 20A and 20B, a semiconductor device 500 may include a multi-bridge-channel-transistor such as an MBCFET®. For example, the semiconductor device 500 may include channel layers 502 disposed on the active region AR while being vertically spaced apart from one another. As shown in FIG. 20B, the active region AR may be disposed under the gate electrode 124 while protruding from an upper surface of the substrate 102, and the channel layers 502 may be vertically spaced apart from the active region AR while being surrounded by a gate insulating layer 522. The gate insulating layer 522 may also cover an upper surface of the element isolation layer 110 and an upper surface of the active region AR while extending in a horizontal direction. The gate insulating layer 522 surrounding the channel layers 502 may be surrounded by the gate electrode 124. As shown in FIG. 20A, the channel layers 502 may connect adjacent ones of the source/drain regions SD.

Although the channel layers 502 are shown as having the form of a nanosheet with a rectangular cross-section in FIGS. 20A and 20B, the exemplary embodiments of the disclosure are not limited thereto. In an embodiment, the cross-section of the channel layers 502 may have a circular shape or an oval shape. In an embodiment, the channel layers 502 may include a group IV semiconductor, e.g., Si, G or SiGe, or a group III-V compound, e.g., InGaAs, InAs, GaSb, InSb, etc.

The semiconductor device 500 may further include inner spacers 523 disposed under the channel layers 502 while contacting opposite side surfaces of the source/drain regions SD. The inner spacers 523 may electrically insulate the gate electrodes 124 from the source/drain regions SD. In an embodiment, the inner spacers 523 may include silicon nitride.

Figure 21A:
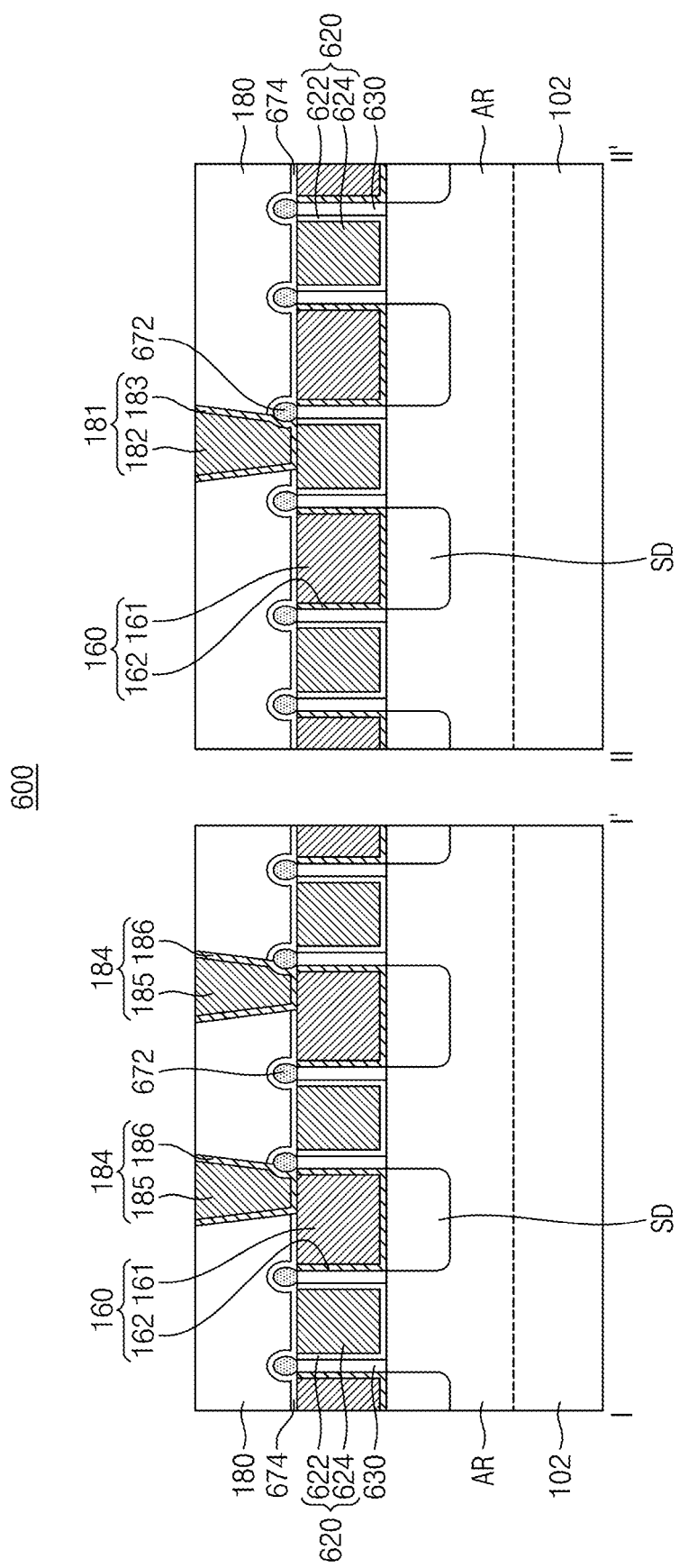
FIGS. 21A and 21B are vertical cross-sectional views of a semiconductor device according to an example embodiment.
Figure 21B:
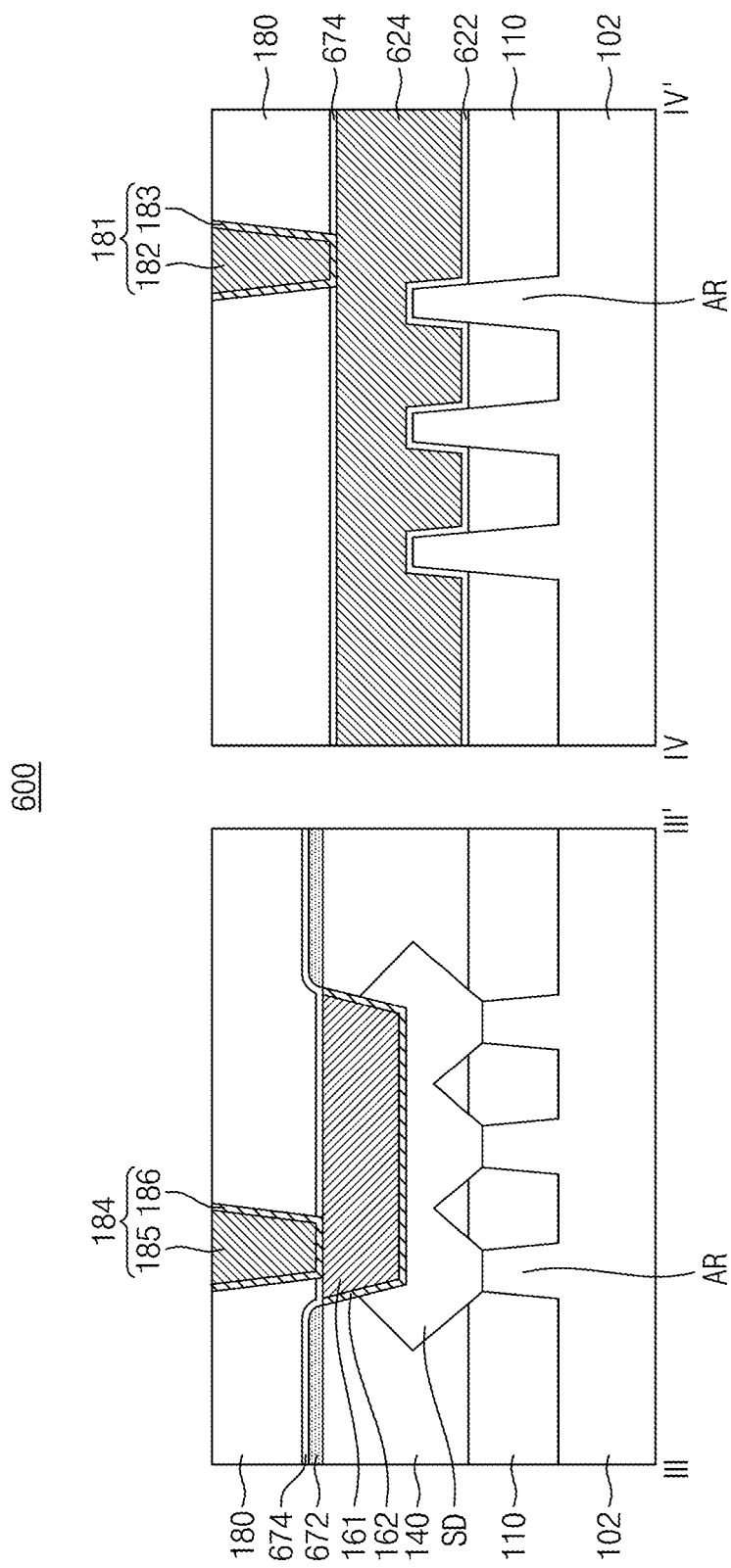
Figure 22:
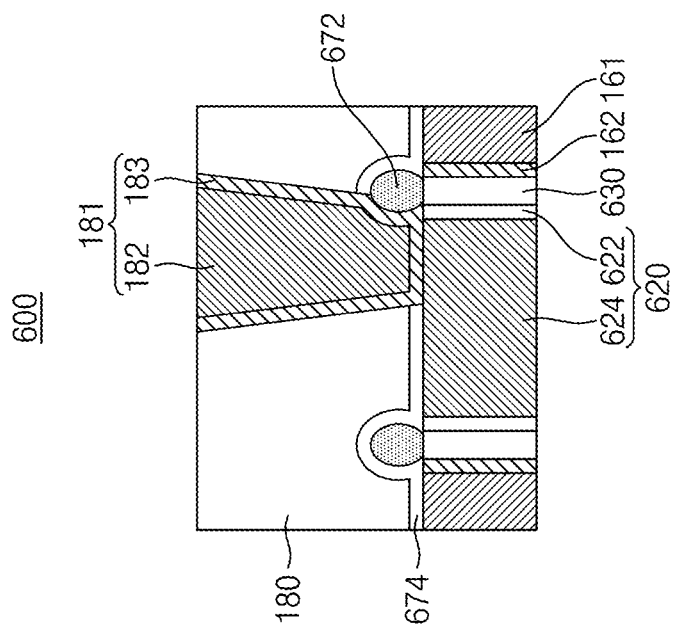
FIG. 22 is an enlarged view of a contact plug in the semiconductor device shown in FIG. 21A.

FIGS. 21A and 21B are vertical cross-sectional views of a semiconductor device according to an example embodiment. FIG. 22 is an enlarged view of the semiconductor device 600 shown in FIG. 21A.

Referring to FIGS. 21A and 21B, the semiconductor device 600 may include a gate structure 620 connected to the gate contact plug 181, gate spacers 630 respectively disposed at opposite sides of the gate structure 620, gate isolation layers 672 respectively disposed on the gate spacers 630, and a capping layer 674 covering the gate structure 620. The gate structure 620 may include a gate insulating layer 622 and a gate electrode 624.

As shown in FIG. 22, an upper surface of the gate structure 620 may be disposed at the same level as an upper surface of the lower source/drain contact plug 160. An upper surface of each gate spacer 630 may be flat, and may be coplanar with the upper surface of the gate structure 620. Each gate isolation layer 672 may have an oval shape having a longer axis and a shorter axis. In an embodiment, the longer axis may extend in a vertical direction, and the shorter axis may extend in a horizontal direction. The capping layer 674 may be conformally disposed along the upper surface of the gate structure 620, the upper surface of the lower source/drain contact plug 160, and upper surfaces of the gate isolation layers 672.

FIGS. 23A to 24B are vertical cross-sectional views illustrating stages in a method of manufacturing the semiconductor device shown in FIGS. 21A and 21B.

Figure 23A:
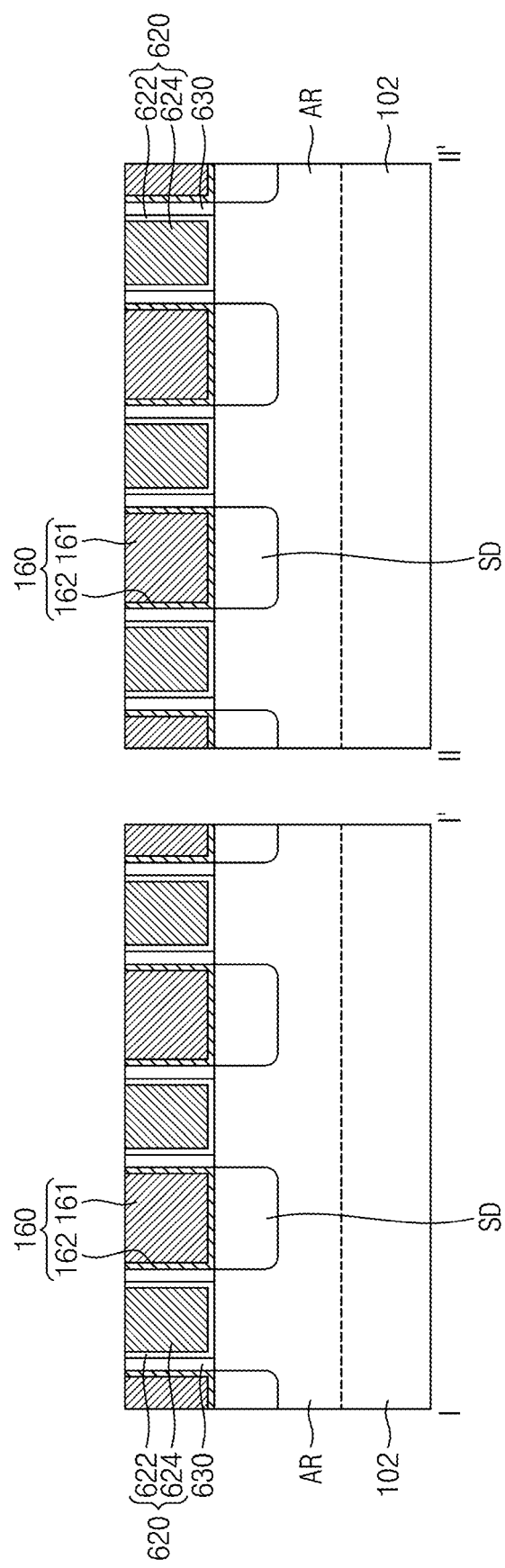
FIGS. 23A to 24B are vertical cross-sectional views of stages in a method of manufacturing the semiconductor device shown in FIGS. 21A and 21B.
Figure 23B:
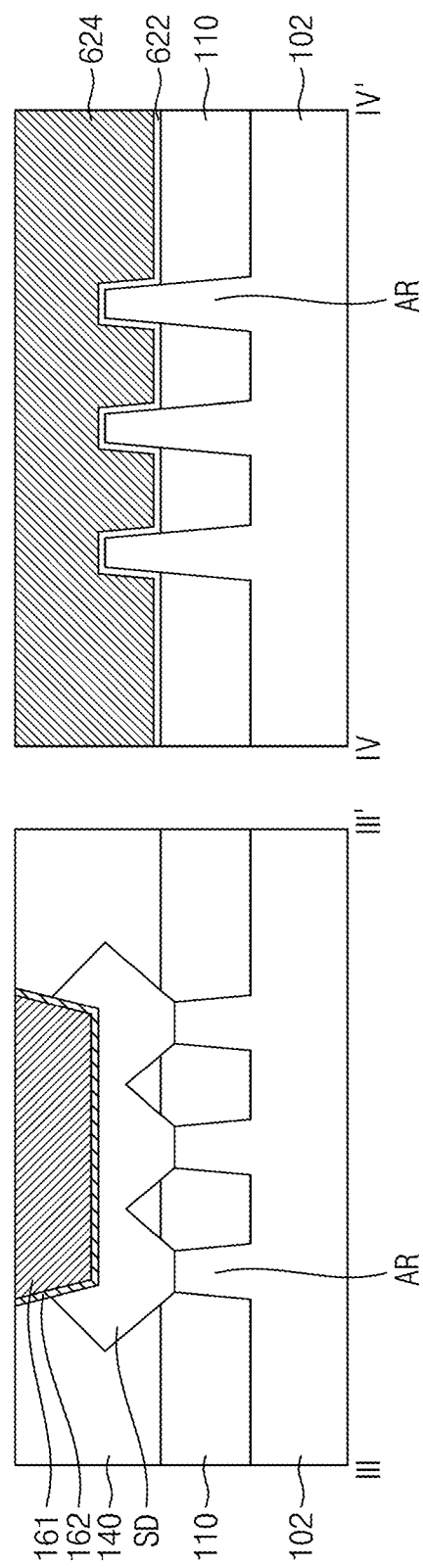

Referring to FIGS. 23A and 23B, the gate structures 620 intersecting active regions AR and the lower source/drain contact plugs 160 disposed at opposite sides of the gate structures 620 may be provided. Formation of the gate structures 620 and the lower source/drain contact plugs 160 may include additionally performing a buffing CMP process after the planarization process described with reference to FIGS. 10A and 10B in order to remove the upper spacers 150 and the etch stop layer 152. Upper surfaces of the planarized gate structures 620 may be coplanar with upper surfaces of the lower source/drain contact plugs 160. In addition, an upper surface of the interlayer insulating layer 140 may be coplanar with the upper surfaces of the gate structures 620.

Alternatively, formation of the gate structures 620 and the lower source/drain contact plugs 160 may include etching the interlayer insulating layer 140 shown in FIGS. 4A and 4B, thereby forming openings exposing the source/drain regions SD, forming a barrier material and a conductive material filling the openings, and performing a planarization process such that the barrier material and the conductive material are coplanar with gate electrodes 624. The gate capping layer 126 may be removed in the planarization process.

Figure 24A:
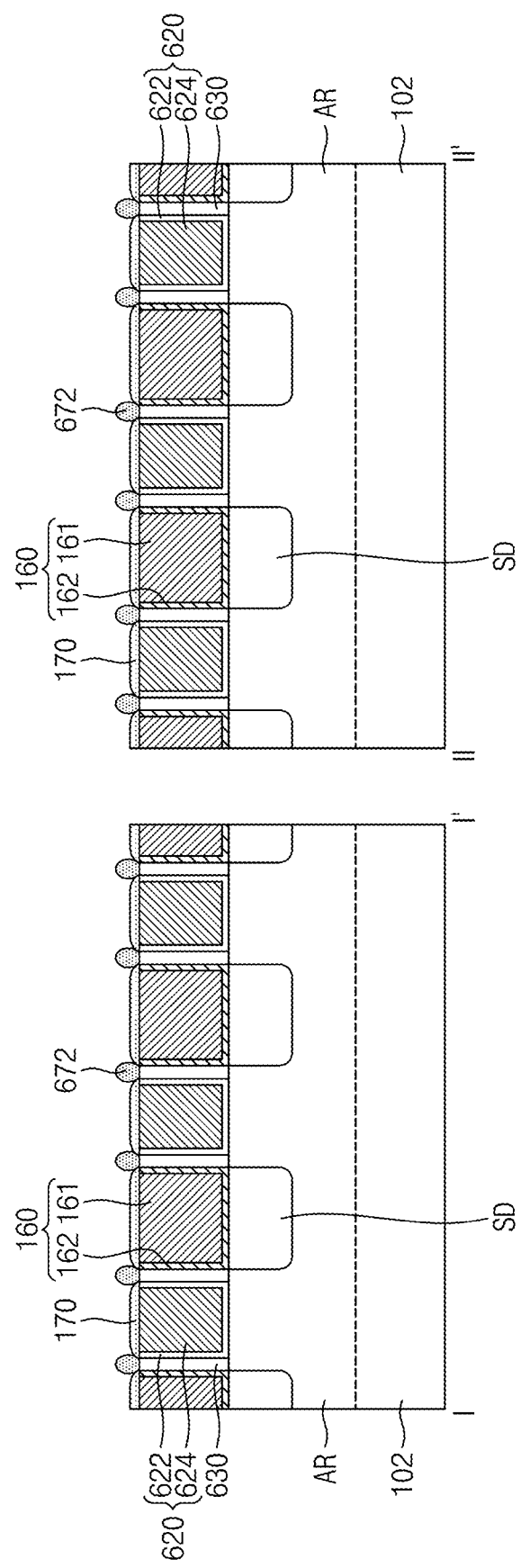
Figure 24B:
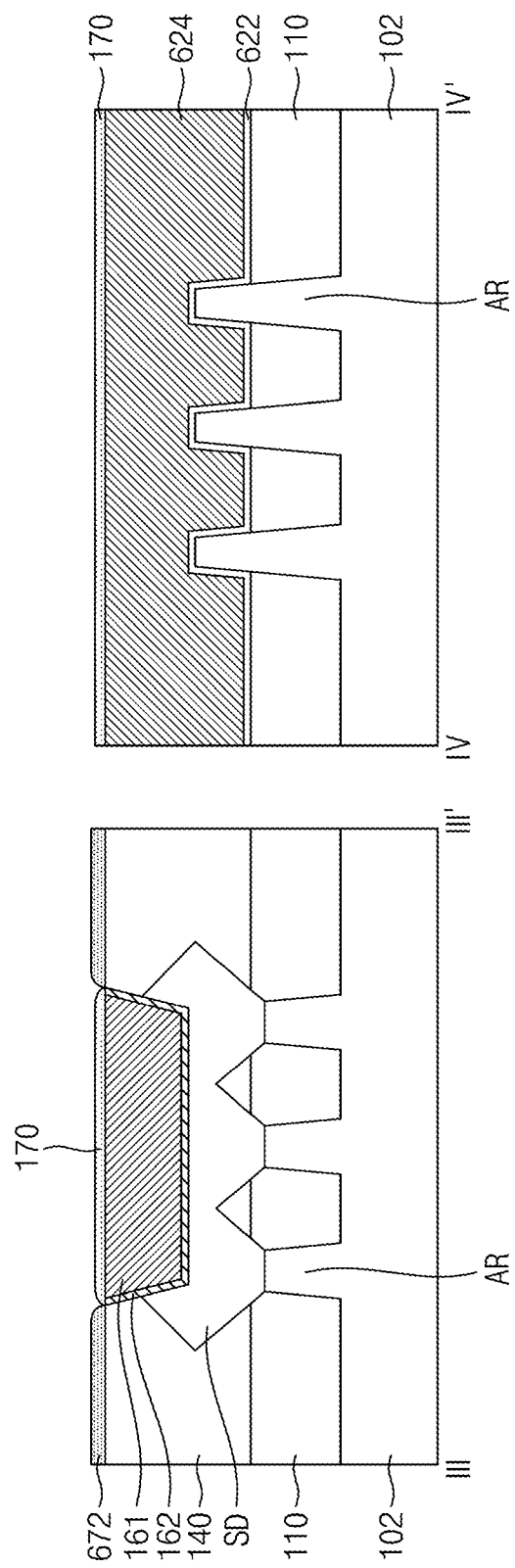

Referring to FIGS. 24A and 24B, suppressants 170 may be selectively formed on the gate structures 620 and the lower source/drain contact plugs 160. For example, the suppressants 170 may not cover the interlayer insulating layer 140 and the upper spacers 150. After formation of the suppressants 170, gate isolation layers 672 may be formed on the interlayer insulating layer 140 and the upper spacers 150. In an embodiment, the gate isolation layers 672 may be formed through an ALD process.

Again referring to FIGS. 21A and 21B, the capping layer 674 covering the lower source/drain contact plugs 160, the gate structures 620, and the gate isolation layers 672 may be formed, and an upper insulating layer 180 may be formed on the capping layer 674. Thereafter, the gate contact plugs 181 and the upper source/drain contact plugs 184 may be formed to extend through the capping layer 674 and the upper insulating layer 180. The gate contact plugs 181 may be connected to the gate structures 620, and the upper source/drain contact plugs 184 may be connected to the lower source/drain contact plugs 160.

Figure 25:
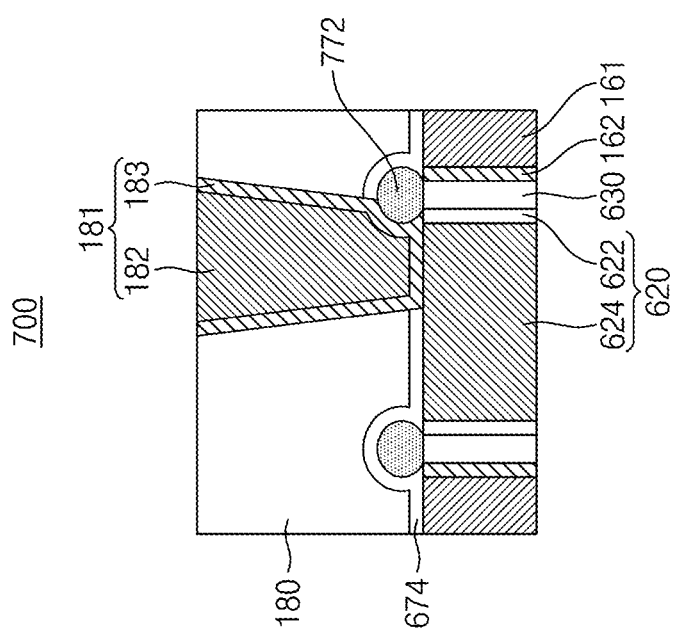
FIGS. 25 to 27 are vertical cross-sectional views of semiconductor devices according to example embodiments.
Figure 26:
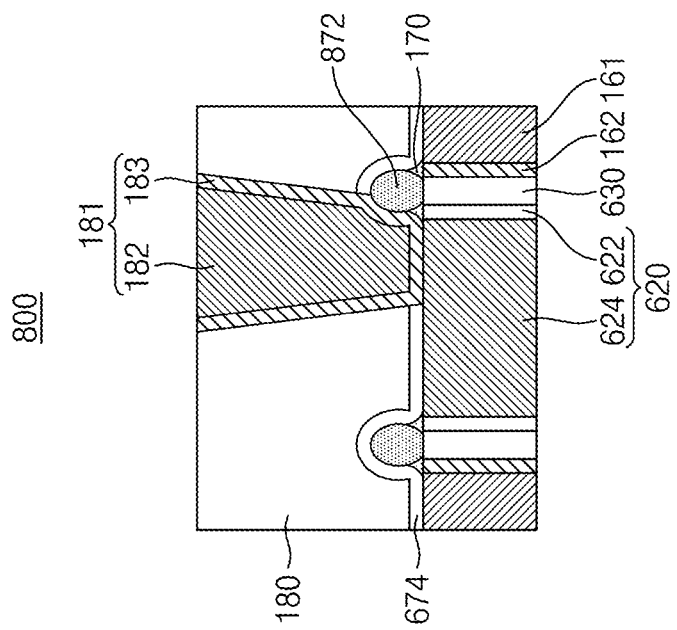
Figure 27:
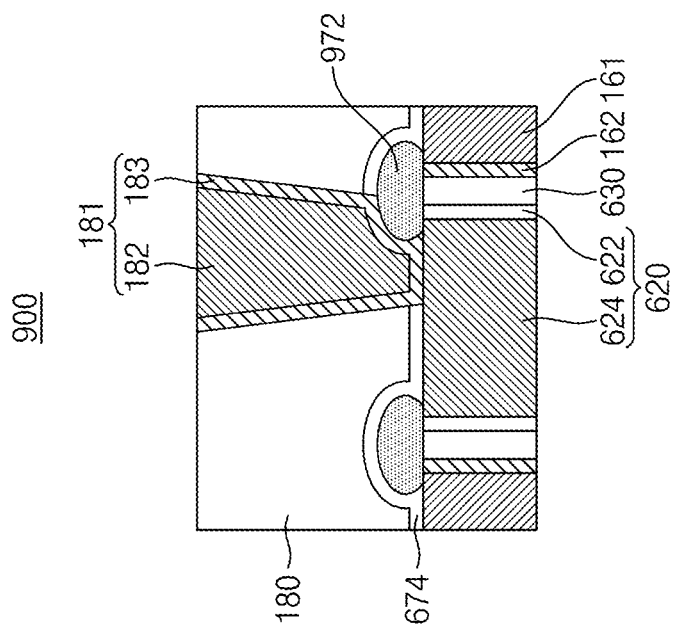

FIGS. 25 to 27 are vertical cross-sectional views of semiconductor devices according to example embodiments.

Referring to FIG. 25, a semiconductor device 700 may include a gate isolation layer 772 contacting an upper surface of the gate spacer 630. In an embodiment, the gate isolation layer 772 may have an oval shape having a longer axis and a shorter axis. The longer axis may extend in a horizontal direction, and the shorter axis may extend in a vertical direction.

Referring to FIG. 26, a semiconductor device 800 may include a gate isolation layer 872 contacting an upper surface of the gate spacer 630. In an embodiment, the gate isolation layer 872 may have an oval shape having a longer axis and a shorter axis. The longer axis may extend in a vertical direction, and the shorter axis may extend in a horizontal direction. The semiconductor device 800 may further include suppressants 170 disposed on the gate structure 620 and the lower source/drain contact plug 160. For example, the suppressants 170 may contact an upper surface of the gate structure 620 or the lower source/drain contact plug 160 while contacting the gate isolation layer 872. The suppressants 170 may contact the capping layer 674 or the gate contact plug 181.

Referring to FIG. 27, a semiconductor device 900 may include a gate isolation layer 972 contacting an upper surface of the gate spacer 630. The gate isolation layer 972 may have an oval shape or a hemispherical shape with a longer axis extending in a horizontal direction. Although the gate isolation layer 972 is shown as partially covering the gate structure 620 and the lower source/drain contact plug 160 in FIG. 27, the exemplary embodiments are not limited thereto. In an embodiment, the gate isolation layer 972 may partially cover at least one of the gate structure 620 and the lower source/drain contact plug 160.

By way of summation and review, exemplary embodiments provide a semiconductor device having a gate isolation layer on a gate spacer, thereby securing insulation among contact plugs and enhancing reliability of a device. That is, the semiconductor device includes a gate isolation layer with dry etching resistance on the gate spacer, so the gate isolation layer is not etched during an etching process for forming a gate contact plug and an upper source/drain contact plug. Therefore, the gate isolation layer is on the gate spacer between the gate electrode and the contact plugs to secure electrical insulation therebetween, thereby preventing or substantially minimizing an electrical short circuit therebetween.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate;
   active regions on the substrate;
   a gate structure intersecting the active regions;
   a source/drain region on the active regions, the source/drain region being at a side surface of the gate structure;
   a gate spacer between the gate structure and the source/drain region, the gate spacer contacting the side surface of the gate structure;
   a lower source/drain contact plug connected to the source/drain region;
   a gate isolation layer on the gate spacer, an upper end of the gate isolation layer being at a higher level than an upper surface of the gate structure and an upper surface of the lower source/drain contact plug;
   a capping layer covering the gate structure, the lower source/drain contact plug, and the gate isolation layer; and
   an upper source/drain contact plug connected to the lower source/drain contact plug and extending through the capping layer.

2. The semiconductor device as claimed in claim 1, further comprising a gate contact plug connected to the gate structure and extending through the capping layer.

3. The semiconductor device as claimed in claim 2, wherein the gate isolation layer electrically insulates the upper source/drain contact plug from the gate structure, and electrically insulates the gate contact plug from the lower source/drain contact plug.

4. The semiconductor device as claimed in claim 2, wherein the upper source/drain contact plug is in contact with the gate isolation layer, and is concave at a portion thereof contacting the gate isolation layer.

5. The semiconductor device as claimed in claim 2, wherein the gate contact plug is in contact with the gate isolation layer, and is concave at a portion thereof contacting the gate isolation layer.

6. The semiconductor device as claimed in claim 1, wherein a maximum horizontal width of the gate isolation layer is 6 nm to 10 nm, and a maximum vertical width of the gate isolation layer is 6 nm to 10 nm.

7. The semiconductor device as claimed in claim 1, wherein the upper surface of the gate structure is at a lower level than the upper surface of the lower source/drain contact plug.

8. The semiconductor device as claimed in claim 7, wherein a height of the gate spacer is gradually reduced, as a distance between the gate spacer and the gate structure decreases.

9. The semiconductor device as claimed in claim 7, further comprising an upper spacer between the gate spacer and the gate isolation layer, an upper surface of the upper spacer being coplanar with the upper surface of the lower source/drain contact plug, and a side surface of the upper spacer being an inclined surface.

10. The semiconductor device as claimed in claim 7, further comprising a suppressant on the gate structure, the suppressant contacting the gate isolation layer.

11. The semiconductor device as claimed in claim 7, wherein the gate isolation layer partially covers at least one of the gate structure and the lower source/drain contact plug.

12. The semiconductor device as claimed in claim 1, wherein the upper surface of the gate structure is coplanar with the upper surface of the lower source/drain contact plug.

13. The semiconductor device as claimed in claim 12, wherein an upper surface of the gate spacer is coplanar with the upper surface of the gate structure.

14. The semiconductor device as claimed in claim 12, wherein the gate isolation layer has an oval shape having a longer axis and a shorter axis, the longer axis extends in a vertical direction, and the shorter axis extends in a horizontal direction.

15. The semiconductor device as claimed in claim 12, wherein the gate isolation layer has an oval shape having a longer axis and a shorter axis, the longer axis extends in a horizontal direction, and the shorter axis extends in a vertical direction.

16. The semiconductor device as claimed in claim 12, further comprising a suppressant on the gate structure, the suppressant contacting the gate isolation layer.

17. The semiconductor device as claimed in claim 12, wherein the gate isolation layer partially covers at least one of the gate structure and the lower source/drain contact plug.

18. A semiconductor device, comprising:
a substrate;
active regions on the substrate;
channel layers on the active regions, the channel layers being vertically spaced apart from one another;
a gate structure intersecting the active regions, the gate structure surrounding the channel layers, and the gate structure including a gate electrode and a gate insulating layer between the channel layers and the gate electrode;
a source/drain region on the active regions, the source/drain region being at a side surface of the gate structure;
a gate spacer between the gate structure and the source/drain region, the gate spacer contacting the side surface of the gate structure;
an inner spacer under the channel layers, the inner spacer contacting a side surface of the source/drain region;
a lower source/drain contact plug on the source/drain region;
a gate isolation layer on the gate spacer, an upper end of the gate isolation layer being at a higher level than an upper surface of the gate structure and an upper surface of the lower source/drain contact plug;
a capping layer covering the gate structure, the lower source/drain contact plug, and the gate isolation layer; and
an upper source/drain contact plug connected to the lower source/drain contact plug and extending through the capping layer.

19. A semiconductor device, comprising:
a substrate;
active regions on the substrate and extending in a first horizontal direction, the active regions being spaced apart from one another in a second horizontal direction intersecting the first horizontal direction;
a gate structure intersecting the active regions and extending in the second horizontal direction;
a source/drain region on the active regions and disposed at a side surface of the gate structure;
a gate spacer between the gate structure and the source/drain region, the gate spacer contacting the side surface of the gate structure;
an interlayer insulating layer covering the source/drain region;
a lower source/drain contact plug connected to the source/drain region and extending through the interlayer insulating layer, an upper surface of the gate structure being at a lower level than an upper surface of the lower source/drain contact plug;
a gate isolation layer covering the gate spacer and the interlayer insulating layer, an upper end of the gate isolation layer being at a higher level than the upper surface of the gate structure and the upper surface of the lower source/drain contact plug;
a capping layer covering the gate structure, the lower source/drain contact plug, and the gate isolation layer;
an upper insulating layer covering the capping layer; and
an upper source/drain contact plug connected to the lower source/drain contact plug and extending through the capping layer and the upper insulating layer.

20. The semiconductor device as claimed in claim 19, further comprising:
a gate contact plug connected to the gate structure and extending through the capping layer; and
an upper spacer between the gate spacer and the gate isolation layer, the gate isolation layer contacting the upper spacer, the capping layer, and the gate contact plug.

* * * * *